US007606059B2

(12) United States Patent
Toda

(10) Patent No.: US 7,606,059 B2
(45) Date of Patent: Oct. 20, 2009

(54) THREE-DIMENSIONAL PROGRAMMABLE RESISTANCE MEMORY DEVICE WITH A READ/WRITE CIRCUIT STACKED UNDER A MEMORY CELL ARRAY

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 405 days.

(21) Appl. No.: 10/548,291

(22) PCT Filed: Mar. 18, 2003

(86) PCT No.: PCT/JP03/03257

§ 371 (c)(1),
(2), (4) Date: Sep. 1, 2005

(87) PCT Pub. No.: WO2004/084229

PCT Pub. Date: Sep. 30, 2004

(65) Prior Publication Data

US 2006/0268594 A1    Nov. 30, 2006

(51) Int. Cl.
*G11C 11/00* (2006.01)
(52) U.S. Cl. .................. 365/148; 365/163; 365/151
(58) Field of Classification Search .................. 365/148, 365/163, 151
See application file for complete search history.

(56) References Cited

U.S. PATENT DOCUMENTS

| | | | |
|---|---|---|---|
| 3,997,883 A | 12/1976 | Wong et al. | |
| 5,991,193 A | 11/1999 | Gallagher et al. | |
| 6,072,716 A | 6/2000 | Jacobson et al. | |
| 6,204,139 B1 | 3/2001 | Liu et al. | |
| 6,418,049 B1 | 7/2002 | Kozicki et al. | |
| 6,504,742 B1 | 1/2003 | Tran et al. | |
| 6,785,156 B2 * | 8/2004 | Baker | 365/148 |
| 7,002,859 B2 * | 2/2006 | Finn et al. | 365/201 |
| 7,335,906 B2 * | 2/2008 | Toda | 257/2 |
| 7,394,680 B2 * | 7/2008 | Toda et al. | 365/148 |
| 7,400,522 B2 * | 7/2008 | Toda et al. | 365/148 |
| 2002/0168820 A1 | 11/2002 | Kozicki et al. | |
| 2003/0031047 A1 | 2/2003 | Anthony et al. | |

(Continued)

FOREIGN PATENT DOCUMENTS

EP    0 337 393 A2    10/1989

(Continued)

OTHER PUBLICATIONS

U.S. Appl. No. 12/128,343, filed May 28, 2008, Toda.

*Primary Examiner*—Andrew Q Tran
(74) *Attorney, Agent, or Firm*—Oblon, Spivak, McClelland, Maier & Neustadt, L.L.P.

(57) ABSTRACT

A programmable resistance memory device includes a semiconductor substrate, at least one cell array, in which memory cells are arranged and formed above the semiconductor substrate. Each of the memory cells has a stack structure of a programmable resistance element and an access element, the programmable resistance element storing a high resistance state or a low resistance state based on the polarity of voltage application in a non-volatile manner. The access element has a resistance value in an off-state in a certain voltage range that is ten time or more as high as that in a select state. A read/write circuit is formed on the semiconductor substrate and underlying the cell array for data reading and data writing in communication with the cell array.

25 Claims, 19 Drawing Sheets

U.S. PATENT DOCUMENTS

| | | | | |
|---|---|---|---|---|
| 2007/0285963 A1* | 12/2007 | Toda et al. | ............ | 365/148 |
| 2007/0285964 A1* | 12/2007 | Toda et al. | ............ | 365/148 |
| 2007/0285965 A1* | 12/2007 | Toda et al. | ............ | 365/148 |
| 2007/0285968 A1* | 12/2007 | Toda et al. | ............ | 365/148 |
| 2008/0106931 A1* | 5/2008 | Toda | ............ | 365/163 |

FOREIGN PATENT DOCUMENTS

| | | |
|---|---|---|
| EP | 0 495 494 A1 | 7/1992 |
| EP | 1 081 714 A1 | 3/2001 |
| EP | 1 265 286 A2 | 12/2002 |
| JP | 2001-525606 | 12/2001 |
| JP | 2002-530850 | 9/2002 |
| JP | 2003-7977 | 1/2003 |
| WO | WO 99/28914 | 6/1999 |
| WO | WO 00/30118 | 5/2000 |
| WO | WO 02/47089 A2 | 6/2002 |
| WO | WO 03/085675 A2 | 10/2003 |

\* cited by examiner

"0" Write (V$_{AK}$<0)

"1" Write (V$_{AK}$>0)

THREE-DIMENSIONAL PROGRAMMABLE RESISTANCE MEMORY DEVICE WITH A READ/WRITE CIRCUIT STACKED UNDER A MEMORY CELL ARRAY

TECHNICAL FIELD

This invention relates to a programmable resistance memory device for storing a resistance state as data in a non-volatile manner, with a programmable resistance element which is switchable between a low resistance state and a high resistance state by reversing the polarity of voltage application.

BACKGROUND ART

Recently, there have been proposed some memory devices having programmable resistance elements. One of these memory devices is known as a phase change memory which uses phase transition between an amorphous state and a crystalline state of a memory material (for example, U.S. Pat. No. 6,314,014B1). In such a phase change memory device, by controlling the current of a chalcogenide cell, reversible switching may be performed between a crystalline state (i.e. low resistance state) and an amorphous state (i.e. high resistance state). By applying a large current to a cell so as to cause the cell chalcogenide to be melted, then rapidly cooled down it, a low resistance state may be written. Annealing the chalcogenide to such a degree as to crystallize it without melting, and a high resistance state may be written. Therefore, it is possible to obtain an electrically rewritable non-volatile memory device.

Other programmable resistance memories have been proposed as including programmable resistances switchable between a low resistance state and a high resistance state by reversing the polarity of voltage application. One of these has an ion conductor formed of a chalcogenide containing metals (for example, U.S. Pat. No. 6,418,049B1), and another one has a polymer in which conductive particles are dispersed (for example, U.S. Pat. No. 6,072,716). In these memories, dendrite growth and retraction thereof in a solid by voltage application are used. In order to write a low resistance state into a cell, a voltage is applied between the anode and cathode of a cell in such a polarity that the anode is positive. As a result, a dendrite grows from the cathode to reach the anode, whereby the cell comes to be in a low resistance state. A reverse voltage application retracts the dendrite to cause the cell to be in a high resistance state. Such a resistance change is reversible, and the low resistance state and the high resistance state may be stored in a non-volatile manner.

It has been suggested that it is possible to achieve an electrically rewritable non-volatile memory with a high density by use of such a programmable resistance. However, there has not been proposed a detailed configuration of a cell array and a read/write circuit thereof. In order to achieve a practical non-volatile memory with a high density and a high performance, how to combine the programmable resistance with what kinds of switching devices for constituting a cell array, how to construct the read/write circuit in communication with the cell array, and the like become important technical issues.

DISCLOSURE OF INVENTION

A programmable resistance memory device according to one aspect of the present invention includes:
a semiconductor substrate;
at least one cell array, in which memory cells are arranged, formed above the semiconductor substrate, each the memory cell having a stack structure of a programmable resistance element and an access element, the programmable resistance element storing a high resistance state or a low resistance state determined due to the polarity of voltage application in a non-volatile manner, the access element having such a resistance value in an off-state in a certain voltage range that is ten times or more as high as that in a select state; and
a read/write circuit formed on the semiconductor substrate as underlying the cell array for data reading and data writing in communication with the cell array.

EMBODIMENTS

Figure 1:
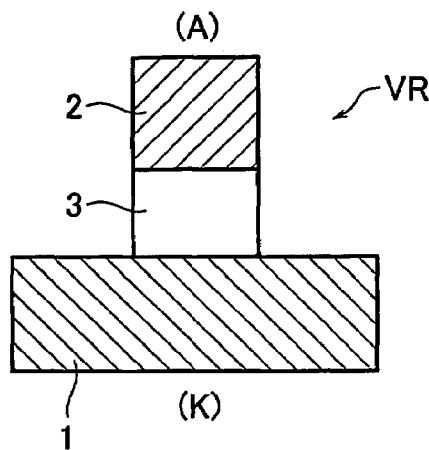
FIG. 1 is a diagram for explaining the principle of data write for a programmable resistance memory element according to an embodiment of the present invention.
Figure 1:
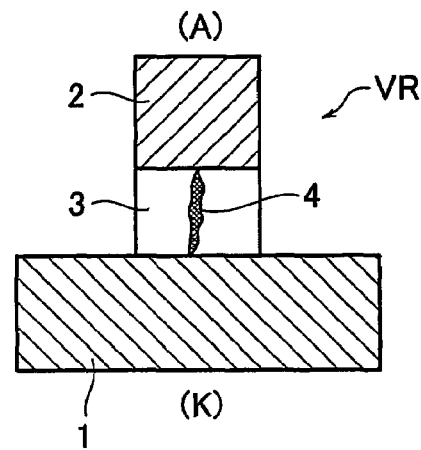

FIG. 1 shows a principle configuration of a programmable resistance (variable resistance) VR used in the present invention. The programmable resistance VR is formed of a resistance film 3 serving as a memory material, and cathode and anode electrodes 1 and 2 sandwiching the resistance film 3. The resistance film 3 is, for example, an ion conductor (solid electrolyte) formed of a chalcogenide containing metal ions such as silver, copper and the like. For example, Ge—S, Ge—Se and the like may be used as the chalcogenide. In the case that the resistance film 3 is formed of the above-described chalcogenide, the electrodes 1, 2 are formed containing silver.

The resistance film 3 stores, for example, a high resistance state as a data "0" and a low resistance state as a data "1". In this programmable resistance VR, by applying a positive anode-cathode voltage ($V_{AK}>0$) that is over a threshold value, and a data "1" will be written. By applying a negative anode-cathode voltage ($V_{AK}<0$) that is over a threshold value, and a data "0" will be written. When "1" data is written, as a result of the voltage application of $V_{AK}>0$, a conductive dendrite 4 grows from the cathode electrode 1 toward the anode electrode 2 in the resistance film 3 as shown in FIG. 1. When the dendrite 4 reaches the anode electrode 2, the low resistance state (data "1") is obtained. By applying a reverse voltage, and the dendrite 4 is retracted or broken, whereby the high resistance state (data "0") is obtained. Such a low resistance state and a high resistance state may be statically held as long as a voltage is not applied over the threshold.

It should be appreciated that the resistance film 3 may be formed of a polymer in which conductive particles are dispersed (for example, carbon polymer in which carbon black particles are dispersed). In this case, a low resistance state and a high resistance state are reversibly written based on the same principle as above.

The principle of the above-described memory operation is based on a mechanism as described below. An ion conductor or a polymer is amorphous, and potential barriers are formed at random and statically therein. In addition, in the potential barrier distribution, potential valleys are formed continuously from the cathode to the anode. By dispersing some of metals in such a solid material, and it is possible to move metal ions along the potential valleys due to electric field application. When a voltage is applied in such a polarity that the anode side is positive, metal ions move toward the cathode, and metal dendrite grows from the cathode electrode. Reverse the polarity of the electric field, and the metals in the dendrite are charged and separated from the dendrite, and move toward the cathode along the potential valleys. As a result, the dendrite may be retracted.

Data read of such a programmable resistance VR may be performed by current monitoring when a voltage is applied to the programmable resistance VR at a level such that dendrite growth and retraction thereof do not occur. Alternatively, it is possible to use a large read voltage without data disturbance in a condition that it has a polarity so as to accelerate the data "0", "1" state.

Figure 2:
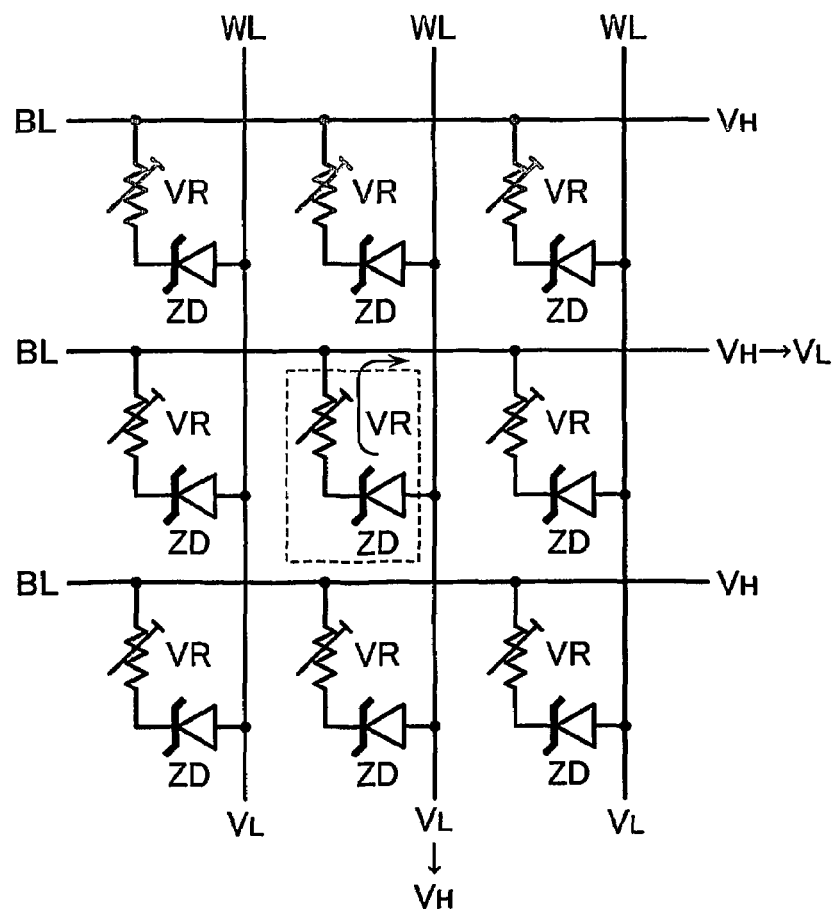
FIG. 2 shows a basic cell array and a voltage application mode thereof for a selected cell according to the embodiment.

FIG. 2 shows a basic cell array of a programmable resistance memory in accordance with an embodiment, with respect to a 3×3 cell matrix. A plurality of first wirings (hereinafter, bit lines BL) are provided in parallel, and a plurality of second wirings (hereinafter, word lines WL) are provided to cross the bit lines BL. Memory cells MC are laid out at the respective crossing points of these word lines WL and bit lines BL. The memory cell MC is a series-connection circuit of a programmable resistance VR and a Zener diode ZD. The anode of Zener diode ZD is connected to word lines WL.

In a non-select state, the bit lines BL are held at a high level voltage $V_H$, and the word lines WL are held at a low level voltage $V_L$. In this state, Zener diodes ZD are in a reverse-biased state and thus are in an off-state. FIG. 2 shows a case such that cell selection is performed by use of a forward-bias characteristic of the Zener diode ZD. In detail, in order to select a cell MC which is surrounded by broken lines, a selected word line WL is held at the high level voltage $V_H$, and a selected bit line BL is held at the low level voltage $V_L$; whereby, at the selected cell, its diode ZD becomes forward-biased to be in an on-state, and a voltage is applied to one programmable resistance VR.

Figure 3:
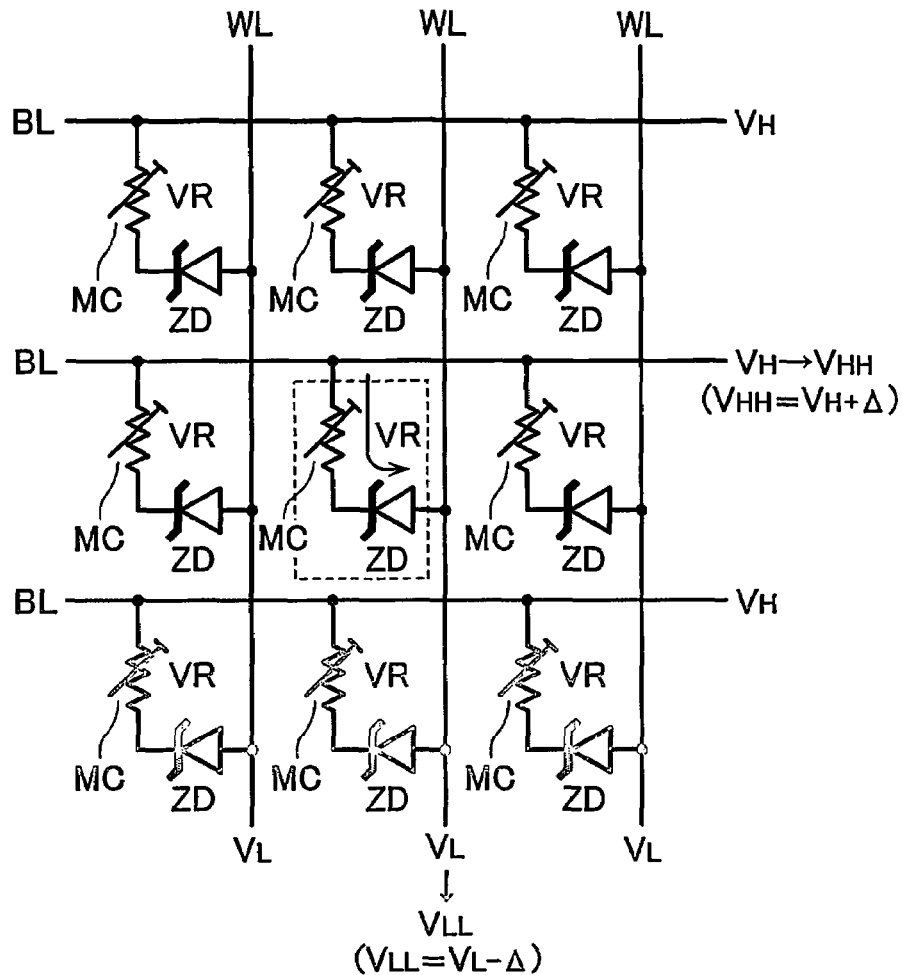
FIG. 3 shows another voltage application mode for the selected cell in the basic cell array.

FIG. 3 shows a case such that a reverse bias is applied to the programmable resistance VR in the same cell array as shown in FIG. 2. In this case, breakdown of the Zener diode ZD is used. Zener breakdown is generated by band to band tunneling of the diode junction, and breakdown start voltage (Zener voltage) Vz may be controlled by the impurity concentration of the diode. Similarly to FIG. 2, in a non-select state, the bit lines BL are held at a high level voltage $V_H$, and the word lines WL are held at a low level voltage $V_L$. In order to select a cell MC which is surrounded by broken lines, a selected word line WL is held at a low level voltage $V_{LL}$ lower than $V_L$, and a selected bit line BL is held at a high low level voltage $V_{HH}$ higher than $V_H$ (for example, $V_{LL}=V_L-\Delta$, $V_{HH}=V_H+\Delta$, where $\Delta$ is a voltage level variation); whereby, at the selected cell, a large backward bias is applied to the diode ZD, thereby causing it breakdown. As a result, a voltage with a polarity opposite to that in FIG. 2 may be applied to one programmable resistance VR.

The above-described level relationship is an example. For example, in FIG. 2, although the non-selected bit lines and selected word line are set at the same high level voltage $V_H$, and non-selected word lines and selected bit line are set at the same low level voltage $V_L$, it is not necessary to use the same levels in these cases. With respect to the voltage variation $\Delta$ used in the select mode in FIG. 3, it is not necessary to use the same value for the bit line and word line.

In this embodiment, the cell selection method in which the forward bias characteristic of the diode is used as shown in FIG. 2, is used for "0" data write and data read; and the cell selection method in which the backward breakdown of the diode is used as shown in FIG. 3, is used for "1" data write. Giving attention to one memory cell, read and write characteristics will be described in detail, referring to FIGS. 4 and 5.

Figure 4:
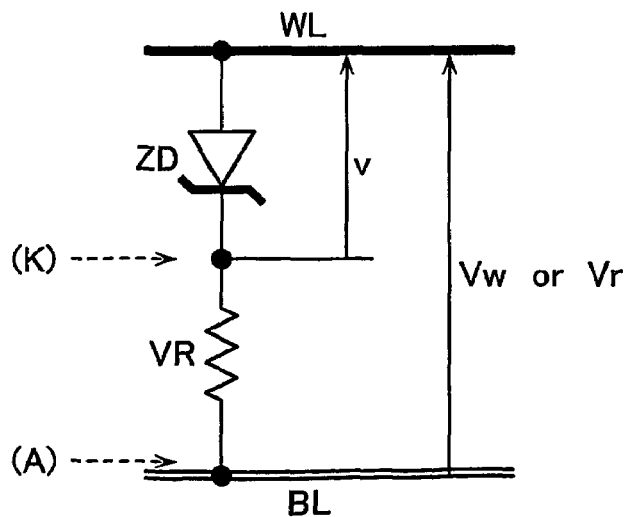
FIG. 4 shows a read/write voltage relationship for a unit cell.

FIG. 4 shows a relationship between a read voltage Vr, a write voltage Vw and a voltage of Zener diode ZD. Programmable resistance VR is connected with such a polarity that anode (A) thereof is connected to the bit line BL. The read voltage Vr and write voltage Vw are ones that are applied between word line WL and bit line BL.

Figure 5:
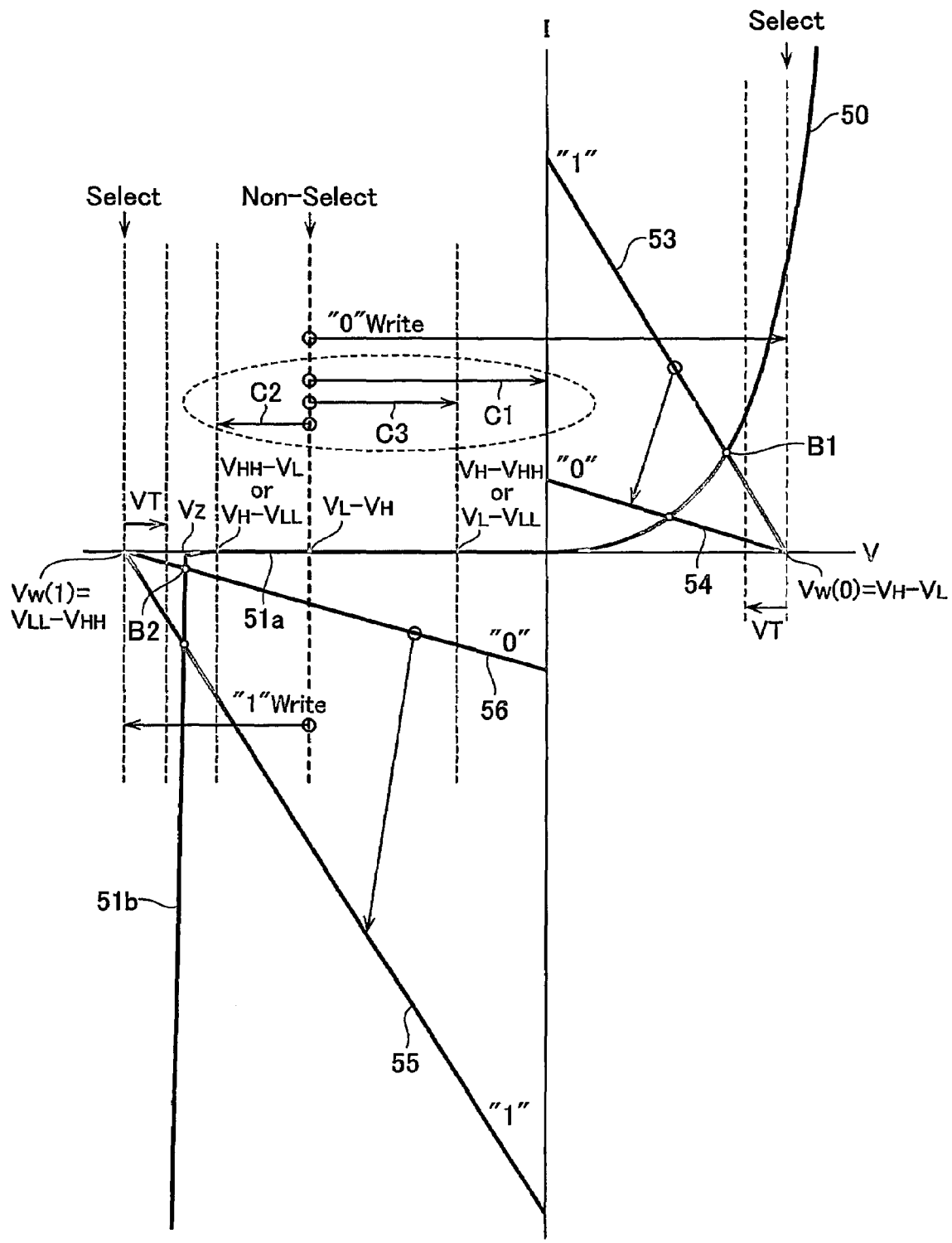
FIG. 5 shows a cell characteristic for explaining a write principle.

FIG. 5 shows characteristic changes of the programmable resistance VR in accordance with write operations by use of a voltage (V)-current (I) characteristic of the diode ZD and a V-I characteristic (i.e., load line) of the programmable resistance VR. In the first quadrant, a forward-bias characteristic curve 50 of the diode ZD is shown. This is expressed as follows; $I=I0\{\exp(qV/kT)-1\}$. In the third quadrant, shown are backward-bias characteristic curves 51a, 51b of the diode ZD. In the non-select state, the voltage applied to the cell is $V_L$-$V_H$, thus the diode ZD is held at a high-impedance off-state on the curve 51a.

In the first quadrant of FIG. 5, "0" write operation is performed as follows. Apply a write voltage Vw(0)=$V_H$-$V_L$ in such a condition that Zener diode ZD becomes in an on-state, and the cell held in a "1" data state (i.e., low resistive state) 53 is written into a "0" data state (i.e., high resistive state) 54. In principle, it is possible to use the first quadrant characteristic for "0" writing or for "1" writing. However, since it is required to use this quadrant for cell data reading as described later, "0" write operation is performed in the first quadrant. This can be said, in other words, that the programmable resistance VR is connected with such a polarity that anode (A) thereof is connected to the bit line BL in the cell array configuration shown in FIGS. 2 to 4. Corresponding with the write voltage application, a load line 53 of "1" data state changes to a load line 54 of "0" data state, as shown by an arrow, as a result of that the dendrite of the programmable resistance is retracted, and resistance value thereof becomes high.

In order to cause the programmable resistance of "1" data to take place, it is required that a voltage higher than a certain level is applied to the programmable resistance. Such a level is shown as a "0" write threshold value VT in FIG. 5. VT is expressed in a direction with reference to Vw(0) as a voltage applied to the programmable resistance VR. If the cross point B1 between the forward bias characteristic curve 50 of the Zener diode ZD and the load line 53 of "1" data state of the programmable resistance is positioned between the origin and Vw(0)–VT, "0" write may be entered into the programmable resistance. As described above, by using the first quadrant for "0" write, and it becomes difficult for a write error to occur in the programmable resistance in a read mode. The reason of this will be described in detail later.

In the third quadrant, "1" write is performed. In this case, by applying a large backward bias, it may cause the Zener diode to breakdown. It allows current with an approximately constant voltage. In the drawing, "1" write operation is shown as follows; when write voltage Vw(1)=$V_{LL}$-$V_{HH}$ is applied as being over the breakdown voltage (Zener voltage) Vz, the programmable resistance VR changes from a high resistive state 56 of "0" data to a low resistive state 55 of "1" data. Load lines 56, 55, which express "0", "1" states respectively, have inclinations in correspondence with resistance values. Therefore, these are in parallel with the load lines 53, 54 in the first quadrant, respectively. In this case, it is also required for successfully writing to the programmable resistance that a voltage higher than a threshold value VT is applied to it. This threshold value VT is expressed in a positive direction with reference to Vw(1). If the cross point B2 between the breakdown characteristic curve 51b of the Zener diode ZD and the load line 56 of "0" data state of the programmable resistance is positioned between the origin and Vw(1)+VT, "1" write may be entered into the programmable resistance. Voltages $V_{LL}$, $V_{HH}$ and the like are selected in such a condition that sufficiently high voltage is applied to the programmable resistance.

If the resistance value of "1" data written programmable resistance is too low, a large current will flow through the Zener diode ZD, thereby causing thermal breakdown. Therefore, it is required to give attention to the current value. Corresponding to some cases, it will be necessary to include a current limiter.

If the third quadrant is used for "0" writing, there is not any danger of thermal breakdown, because the load line variation due to writing is in such a direction that the current value decreases. In this case, however, since it is required to use the first quadrant for "1" writing, the possibility of erroneous writing in a read operation is certain.

In FIG. 5, voltage variations C1 to C3, which are applied to non-selected cells during selective writing operation for the cell array shown in FIGS. 2 and 3, are shown. C1 is a voltage variation of non-selected cells along the selected bit line and selected word line during "0" data writing shown in FIG. 2; C2 is a voltage variation of non-selected cells along the selected bit line and selected word line during "1" data writing shown in FIG. 3; and C3 is a voltage variation of non-selected cells along the selected bit line and selected word line in such cases that during a "1" writing operation for a cell as shown in FIG. 3, "0" writing is performed for another cell as shown in FIG. 2. Such cases are not used in the above-described write operation. It is required that these voltage variations C1 to C3 are insufficient to break data the non-selected cells. Therefore, it is necessary for selecting the values of $V_H$, $V_{HH}$, $V_L$ and $V_{LL}$ in such a condition that the voltage variations do not cause the Zener diodes of the non-selected cells to be forward-biased to turn on, or do not cause those breakdown in the backward-bias direction.

Figure 6:
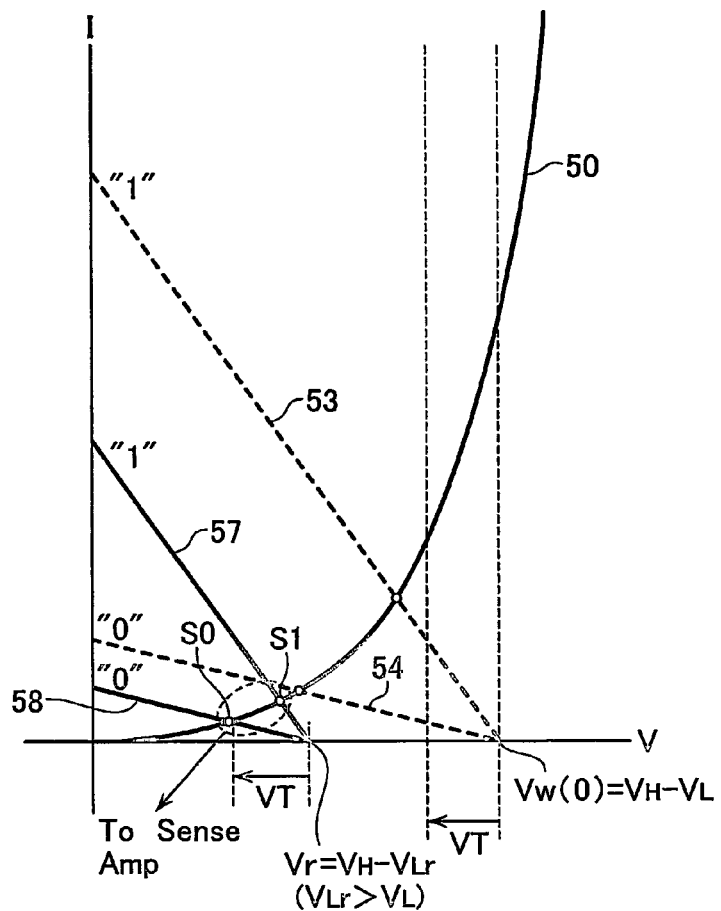
FIG. 6 shows a cell characteristic for explaining a read principle.

FIG. 6 shows a characteristic of read operation which is performed in the first quadrant, with the "0" write characteristic (shown by broken lines). Since it is necessary to perform a read operation with a low voltage necessary for preventing the cells from erroneous write, the read operation in accordance with this embodiment is performed in the first quadrant similarly to "0" write. For example, in a read mode, the high level voltage $V_H$ is applied to a selected word line, and a low level voltage $V_L$r, which is higher than $V_L$, is applied to a selected bit line. At this time, detection of a current difference or a voltage difference between crossing points S0 and S1 of the forward-biased characteristic curve 50 of the Zener diode and the load lines 58, 57 of "0", "1" data by a sense amplifier, and read data may be determined.

In the above-described read operation, it is required to prevent the cell from erroneous write due to the read voltage application. As shown in FIG. 6, as long as the voltage applied to the programmable resistance is set at lower than the threshold value VT in the "1" data read operation, no erroneous writes occur. In FIG. 6, in the "0" data read operation, a voltage slightly higher than the threshold value VT is applied to the programmable resistance. However, this becomes a "0" write mode. That is, a "0" read operation becomes a "0" rewrite operation, thereby not being an erroneous write.

As previously described, it is possible to use the first quadrant for "1" data writing in principle. However, in such the case, a "0" read operation becomes a weak "1" write mode. To avoid such the mode, it is preferable to use the first quadrant for "0" write operations.

As described above, in the read scheme of FIG. 6, as long as that the crossing point S1 for "1" data reading is in the voltage range between Vr and Vr-VT, no erroneous writes occur. In other words, it is possible to set the read voltage Vr without considering the crossing point S0 for "0" data reading. Therefore, a sense margin and a sense speed may be improved. Supposing that the third quadrant is used for data read operation, since Zener voltage Vz is approximately constant, it is difficult to obtain a sense margin necessary for preventing the erroneous write.

As above-explained, in this embodiment, a Zener diode serves as an access element for applying voltages to the programmable resistance in opposite polarities, and the forward bias characteristic and the backward bias breakdown characteristic thereof are be used. In the backward bias characteristic, there is a voltage region, in which a resistance value is regarded as being approximately infinite, under Zener voltage Vz. This is an important characteristic required for the access element of the programmable resistance. In general, it is required of the access element to have such a resistance value in an off-state in a certain voltage range that is ten times or more as high as that in a select state. In consideration of this, it should be appreciated that other access elements, for example, a PN junction diode, a Schottky diode and the like, may be used as long as that they are held in a high-resistive off-state in a certain voltage range. In addition, it should be appreciated that the programmable resistance element may be formed of not only above-described materials but also such a material which carries current in different directions corresponding to the polarity of voltage application to have different resistance values corresponding to the current directions.

So far, the configuration of the basic cell array and the principle of the data read/write operation have been explained. In this embodiment, a three-dimensional cell array structure in which a plurality of cell arrays are stacked above a semiconductor substrate is utilized. Such a three dimensional cell array will be explained below.

Figure 7:
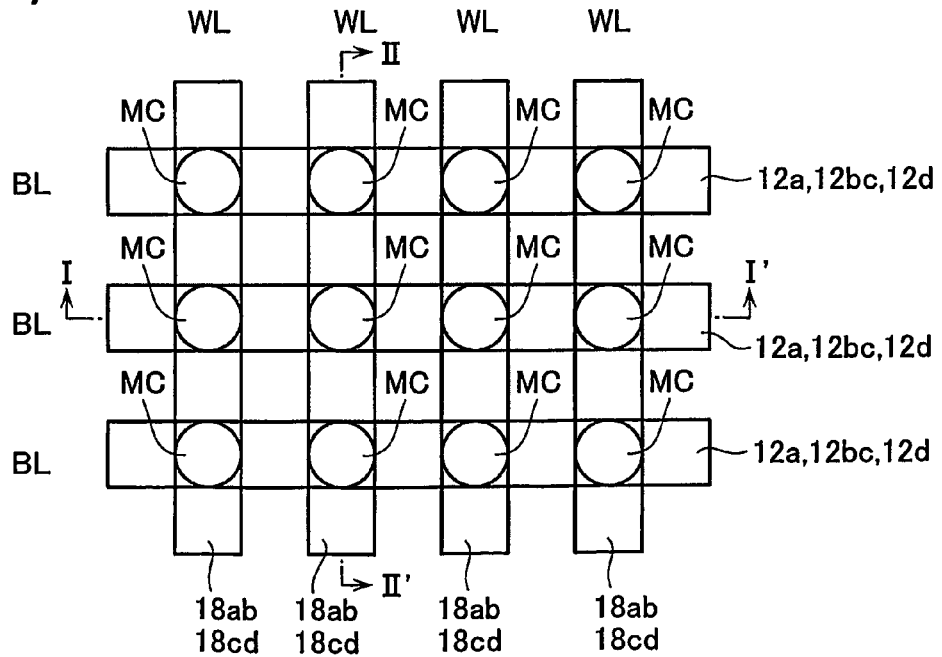
FIG. 7 shows a layout of a three-dimensional cell array according to the embodiment.
Figure 8:
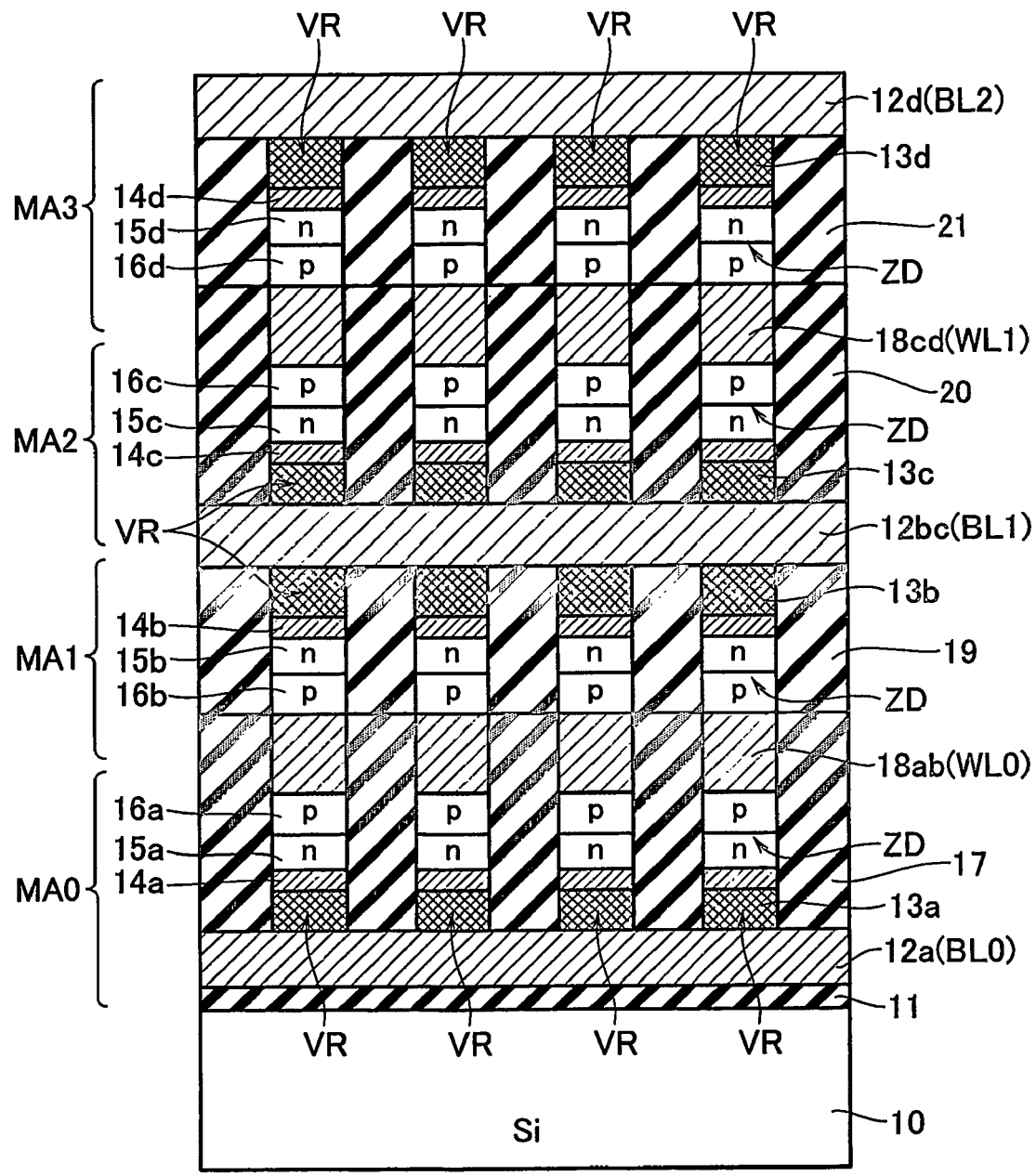
FIG. 8 is a sectional diagram as taken along line I-I' of the three-dimensional cell array shown in FIG. 7.

FIGS. 7 and 8 show a layout and a cross section along I-I' line thereof of a three-dimensional (3D) cell array including four-layer stacked cell arrays MA0 to MA3. In these figures, the same reference numerals are used as the same parts or components in the respective cell arrays, which numerals are distinguished between the cell arrays by addition of suffixes "a", "b", "c" and "d" thereto, and also distinguished between the shared portions of each two cell arrays by addition of suffixes "ab", "bc" and "cd".

A silicon substrate 10 is covered with an insulator film such as a silicon dioxide film. Above the substrate, a plurality of bit lines (BL) 12*a* are arranged in parallel with each other. Pillar-type memory cells MC are arranged on each bit line 12*a* at a certain pitch, each of which has a programmable resistance element VR and a Zener diode ZD stacked thereon. Word lines (WL) 18*ab* are formed to commonly connect the upper ends of the memory cells MC in a direction perpendicular to the bit lines 12*a*, whereby first cell array MA0 is formed.

As above-described, the programmable resistance element VR is written into a "0" state by applying a high level voltage to the word line WL and a low level voltage to the bit line BL to cause it to be forward-biased. Therefore, the programmable resistance element VR is disposed with such a polarity that cathode and anode thereof are to be connected to the word line WL and bit line BL, respectively. This is the same for every cell array stacked.

In detail, the memory cells MC are formed by patterning laminated layers having programmable resistance element layer 13*a*, an ohmic electrode 14*a*, an n$^+$-type silicon layer 15*a* and a p+-type silicon layer 16*a*. The programmable resistance element layer 13*a* is, as shown in FIG. 1, formed of an ion conductor containing a specified metal or a polymer sandwiched by anode and cathode electrodes. An interlayer dielectric film 17 is buried around the memory cells MC to planarize the cell array MA0.

Second cell array MA1 is formed to share the word lines (WL0) 18*ab* with the first cell array MA0. In detail, pillar-type memory cells MC are arranged on each word line 18*ab* at a certain pitch, each of which is formed by patterning the laminated films of a p$^+$-type silicon film 16*b*, an n$^+$-type silicon film 15*b*, an ohmic electrode 14*b* and a programmable resistance element film 13*b* to have a stacked structure of a Zener diode ZD and a programmable resistance element VR. The cell layout is the same as that of the first cell array MA0. Bit lines (BL1) 12*ab* are patterned to commonly connect the programmable resistance element layers 13*b* arranged along a direction perpendicular to the word lines 18*ab*. An interlayer dielectric film 19 is buried around the memory cells MC to planarize the cell array MA1.

The stacked structure of third and fourth cell arrays MA2 and MA3 is periodically formed as similar to the first and second cell arrays MA0 and MA1. Bit lines (BL1) 12*bc* are shared with the second cell array MA1 and the third cell array MA2. The third cell array MA2 and the fourth cell array MA3 share the word lines (WL1) 18*cd* with each other. Bit lines (BL0) 12*a* of the lowest cell array MA0 and bit lines (BL3) 12*d* of the uppermost cell array MA3 are independently prepared, respectively. Although the cross section along II-II' line of FIG. 7 is not shown, the memory cells MC are disposed on the continuously formed word lines WL at the same pitch as the bit lines on this cross section.

As shown in FIG. 7, the bit lines BL and word lines WL of each cell array are formed with such a pattern that they are rotated by 90° to each other, and memory cells MC are sandwiched therebetween at the respective crossing points. For example, the word lines WL and bit lines BL are formed with a line/space=1F/1F, where F is the minimum device feature size, thereby achieving the unit cell area of 4F$^2$. In order to form such the structure, it is possible to use in the patterning process of the memory cells MC two exposures with an exposure mask used for patterning the word lines or the bit lines. In detail, in the lithography process for the laminated layers used for memory cells, exposures are performed twice with an exposure mask in such a manner that the mask is rotated by 90° between the respective exposure steps. Then, the laminated layers are etched so as to retain overlap portions at the two exposure steps, and the memory cells MC are disposed at the respective crossing portions of the bit lines BL and the word lines WL.

Figure 9:
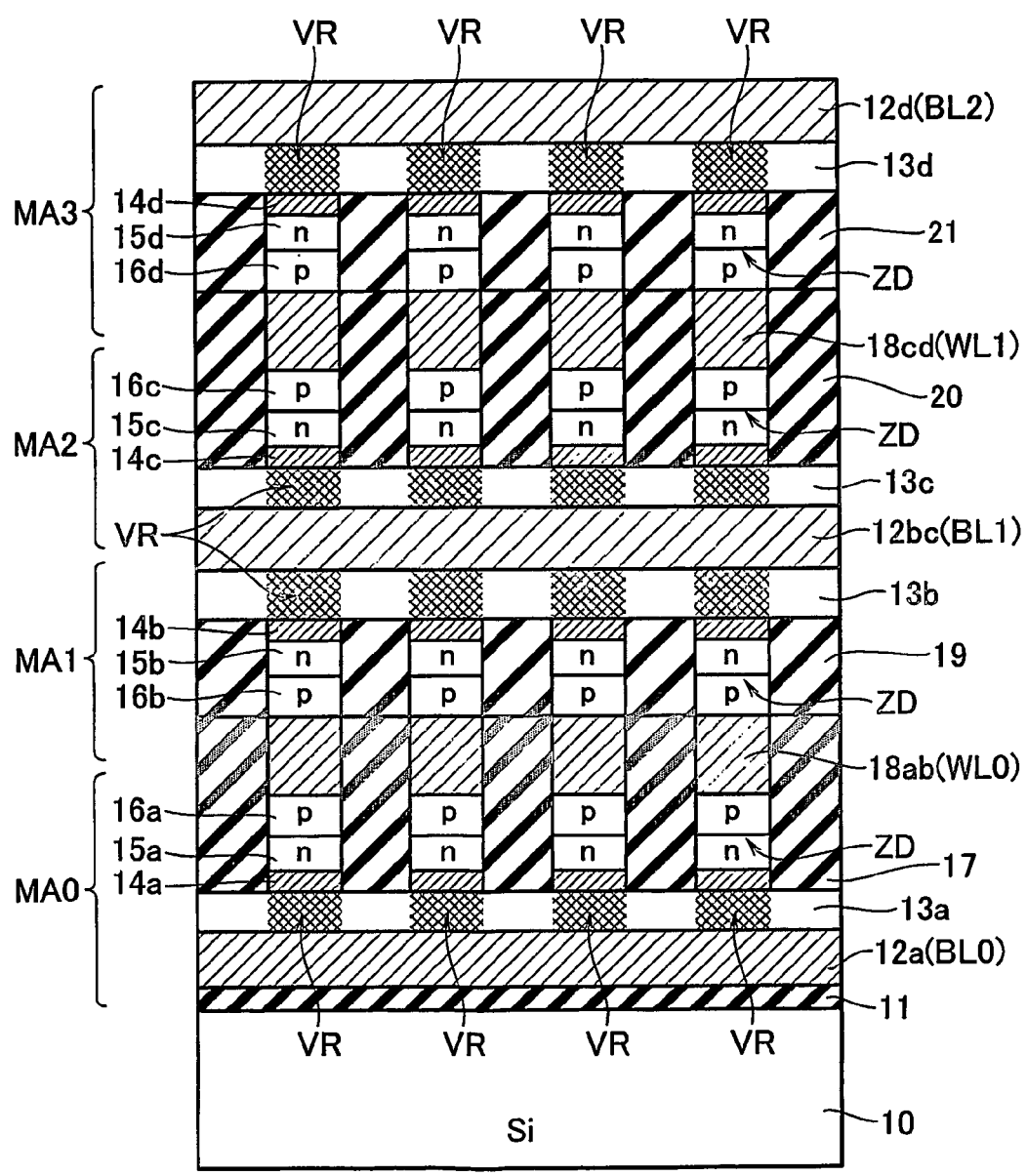
FIG. 9 is a sectional diagram of another three-dimensional cell array.

In FIG. 8, the programmable resistance element layers 13 are disposed only at the cross portions of the bit lines BL and the word lines WL. In contrast to this, in such a case that the leak current of the programmable resistance element layer 13 is negligibly small, the programmable resistance element layer 13 may be retained without patterning, as shown in FIG. 9. In this case, the sandwiched portions between the diode ZD and the bit lines or the word lines within the programmable resistance element layer 13 materially function as the programmable resistance elements VR.

Figure 10:
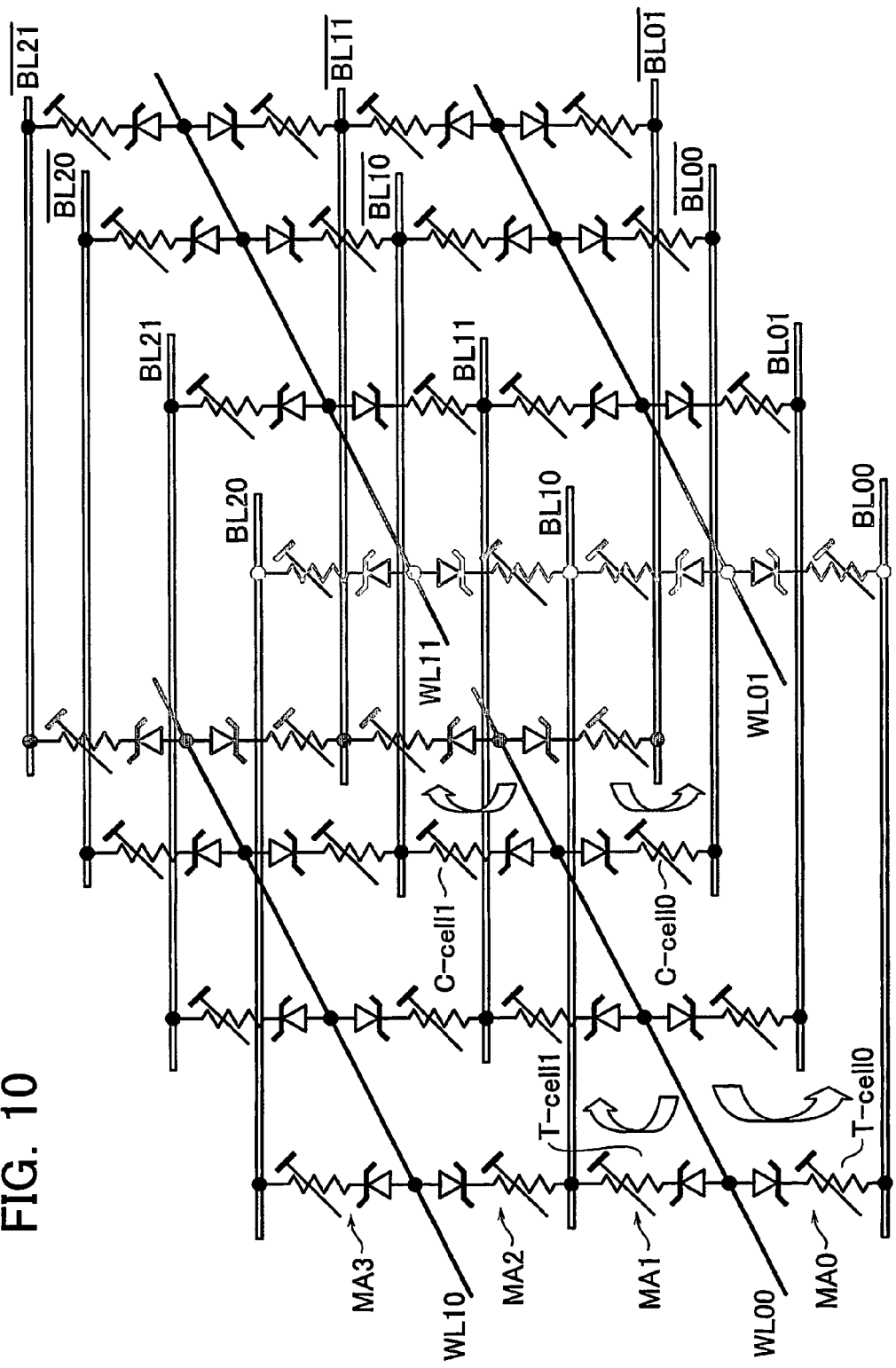
FIG. 10 shows an equivalent circuit of the three-dimensional cell array.

FIG. 10 shows a three-dimensional equivalent circuit of the 3D cell array formed as above-described. In order to prevent the bit lines from mutual interference, each two bit lines constitute a pair, and another bit line is disposed between the pair of bit lines. BL00, /BL00, . . . BL01, /BL01, . . . are bit line pairs of the first cell array MA0; BL10, /BL10, BL11, /BL11, are shared bit line pairs between the second and third cell array MA1 and MA2; and BL20, /BL20, BL21, /BL21, . . . are bit line pairs of the fourth cell array MA3. Further, WL0 (WL00, WL01, . . . ) are shared word lines between the first and second cell arrays MA0 and MA1; and WL1 (WL10, WL11, . . . ) are shared word lines between the third and fourth cell arrays MA2 and MA3.

Figure 11:
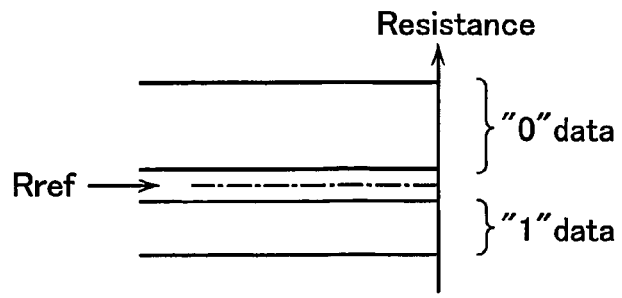
FIG. 11 shows a resistance distribution of memory cells.
Figure 12:
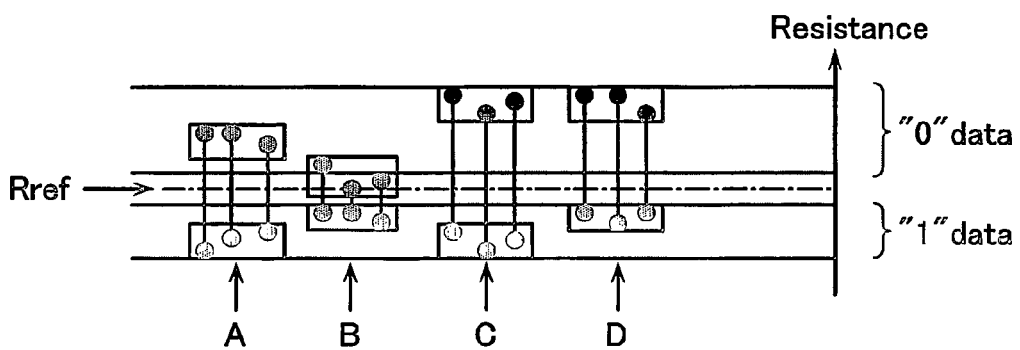
FIG. 12 shows a resistance distribution of the three-dimensional cell array according to the embodiment.

In the above-described 3D cell array in which many memory cells are integrated, variation of cell characteristics causes trouble. In detail, since the resistance value of the programmable resistance element VR is determined by dendrite growth and retraction thereof, variation occurs due to a history thereof, environment and the like. FIG. 11 schematically shows a distribution of the resistance values of data "0", "1". If there is no overlap region, as shown in FIG. 11, between the resistance values of "0" and "1", it is possible to distinguish between "0" and "1" by use of a reference resistance Rref. However, in the 3D cell array that has numerous cells, it becomes difficult to set such a reference resistance Rref. FIG. 12 schematically shows such a situation as above-described. Groups A, B, C and D include nearly disposed plural cells, respectively. By giving attention to each the group, and it is possible to set a reference resistance Rref. However, with respect to the entire cell array, it becomes difficult or impossible.

In consideration of the above-described view points, in this embodiment, two nearby cells constitute a cell pair for storing complementary data therein in such a manner that data "0" is stored in one cell and data "1" is stored in the other cell. Read operation is done by detecting the difference between cell currents of the two cells constituting the pair. By use of this scheme, even if there is a partial overlap between the high resistive state distribution and the low resistive distribution in the entire 3D cell array, it is possible to precisely read/write the cell data.

In FIG. 10, two cell pairs are typically shown as follows: two cells connected to a pair of bit lines BL00 and /BL00, respectively, with sharing a word line WL00 in the cell array MA0, being constitute one cell pair, one of which is a true cell, T-cell0, and the other is a complementary cell, C-cell0; and two cells connected to a pair of bit lines BL10 and /BL10, respectively, sharing a word line WL10 in the cell array MA1, being constituted to another pair cell, one of which is a true cell, T-cell1, and the other is a complementary cell, C-cell1. In every pair of cells, a positive logic value of a binary data is stored in the true cell, and a negative logic value is stored in the complementary cell. Similar cell pairs are selected in the cell arrays MA2 and MA3. In FIG. 10, cell currents at the respective read selection times are shown by arrows.

Figure 13:
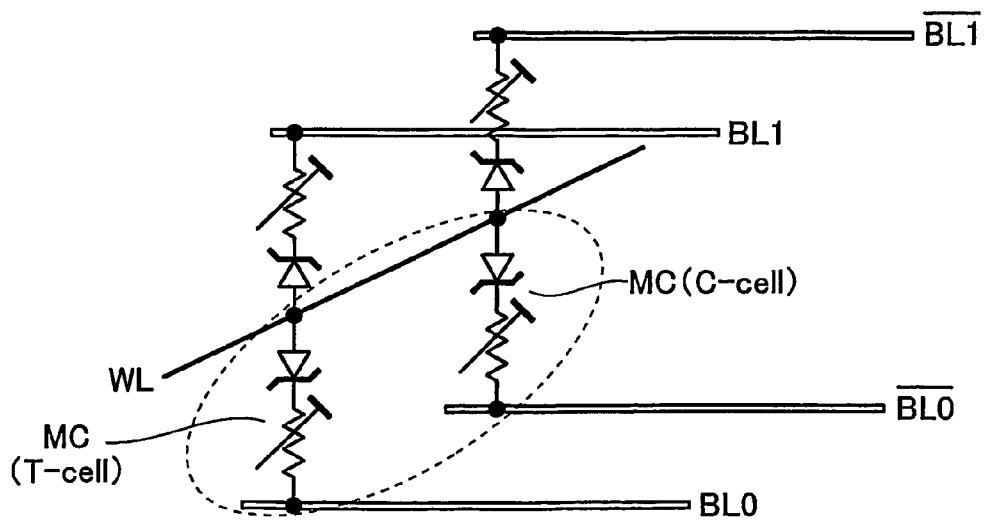
FIG. 13 shows a pair cell configuration method according to the embodiment.
Figure 14:
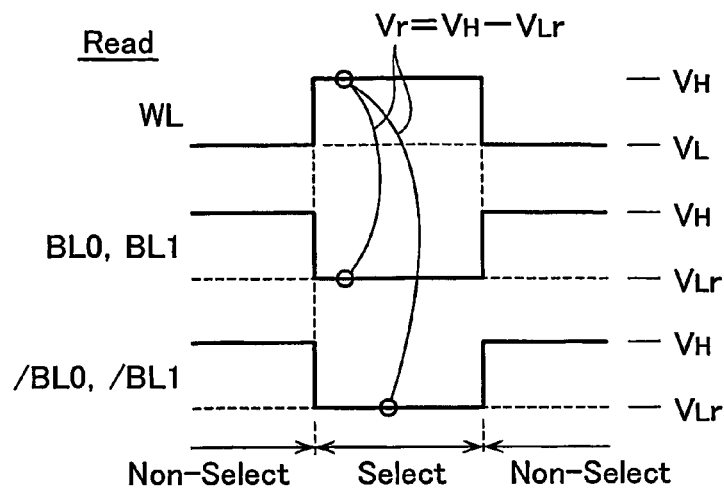
FIG. 14 is a diagram showing operational wave forms for explanation of data read according to the embodiment.

Data read/write methods in such the case that two memory cells constitute a cell pair will be described in detail below. FIG. 13 shows two cell pairs in two cell arrays disposed adjacent up and down to have a shared word line WL. Data read operations for these two cell pairs may be simultaneously performed by use of operation waveforms as shown in FIG. 14. In a non-select mode, $V_H-V_L$ between the bit lines and the word lines is a hold voltage which holds the memory cells in such a non-select state that diodes thereof are backward-biased to be in a high resistive off-state.

In a read selection mode as shown in FIG. 14, a high level voltage $V_H$ is applied to the word line WL which is held at a low level voltage $V_L$ at a non-select time. At the same time, a low level voltage $V_L r$ (>$V_L$) is applied to the bit lines BL0, /BL0, BL1 and /BL1 which are held at high level voltage $V_H$ at the non-select time. In other words, between the selected word line WL and the selected bit line pairs BL0, /BL0 and BL1, /BL1, a read voltage $Vr=V_H-V_L r$ is applied to forward-bias the selected cells. As a result, cell currents flow in the respective cells as above-explained with FIG. 6. Detection of the cell current differences between the pair of bit lines BL0, /BL0, and between the pair of bit lines BL1, /BL1 is by sense amps, and cell data of the respective cell pairs may be determined. Since each cell pair is constituted by two neighbouring cells to store complementary data, it is possible to precisely sense the cell data.

Next, data write operations into cell pairs will be described. Although a pair of cells store a data "0" in one cell and a data "1" in the other cell, "0" and "1" write voltages applied between the word line and the bit line have to be opposite each other as above-described. This means that it is impossible to simultaneously write data into the true cell, T-cell, and the complementary cell, C-cell, which share a word line. Therefore, it is required to perform data write operations for a cell pair twice.

Figure 15:
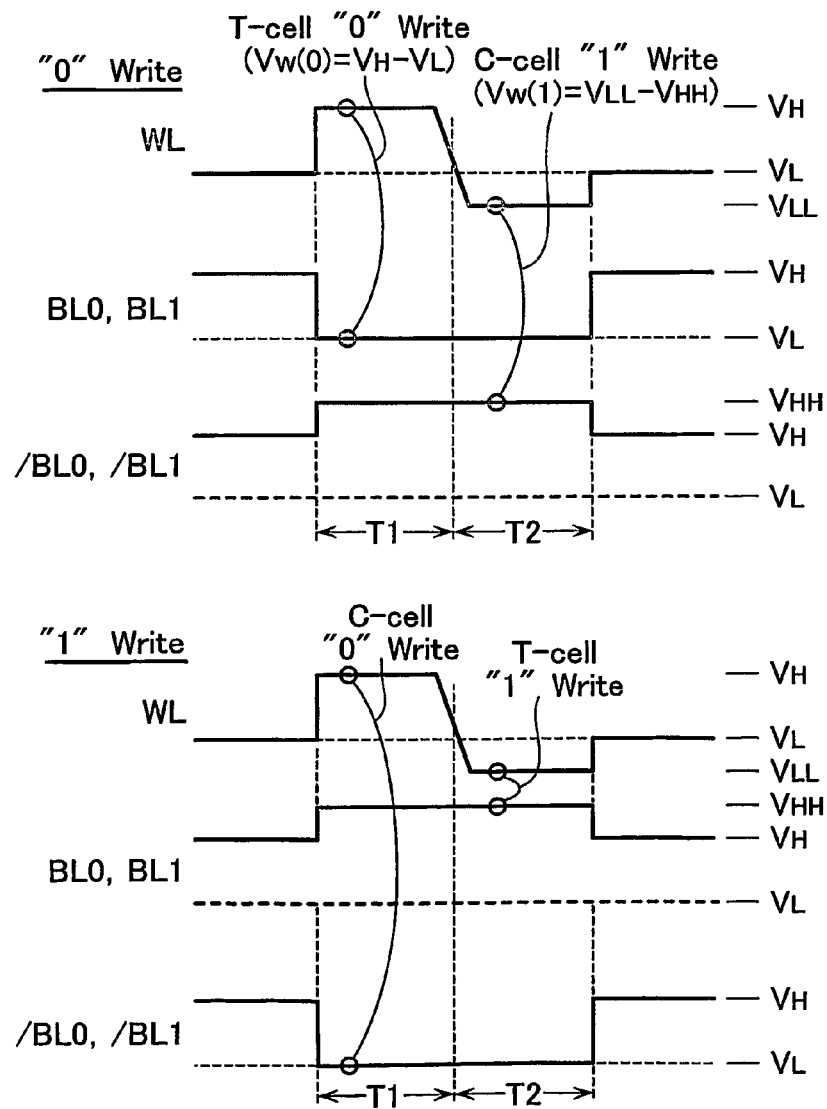
FIG. 15 is a diagram showing operation wave forms for explanation of data write according to the embodiment.

FIG. 15 shows waveforms of "0" data writing (i.e., T-cell="0", C-cell="1") and "1" data writing (i.e., T-cell="1", C-cell="0") into a cell pair. In order to write "0" data, with respect to the bit lines which are held at the high level voltage $V_H$ in the non-select mode, a low level pulse voltage $V_L$ is applied to one bit line pair, BL0 (or BL1), and a high level pulse voltage $V_{HH}$ higher than $V_H$ is applied to the other, /BL0 (or /BL1). A high level voltage $V_H$ is applied to the word line WL in the former half T1 of the above-described bit line selection period, and a low level voltage $V_{LL}$ lower than $V_L$ is applied to the same in the latter half T2.

As a result, in the former half T1, "0" write voltage, $Vw(0)=V_H-V_L$, is applied to one cell, T-cell, of the pair cell to forward-bias the diode thereof due to the high level voltage $V_H$ of the word line WL and the low level voltage $V_L$ of the bit line BL0 (or BL1), whereby the T-cell is written into a "0" data state. At this time, since the voltage applied to the other cell, C-cell, is $V_H-V_{HH}$, the diode of C-cell is held at an off-state. Therefore, no error data are written into the C-cell. In the latter half T2, "1" write voltage, $Vw(1)=V_{LL}-V_{HH}$, is applied to the other cell, C-cell, of the pair cell to cause the diode thereof to breakdown due to the low level voltage $V_{LL}$ of the word line WL and the high level voltage $V_{HH}$ of the bit line /BL0 (or /BL1), whereby the C-cell is written into a "1" data state. At this time, the voltage applied to the cell T-cell, in which a data has been written, is $V_{LL}-V_L$. Since the diode of the T-cell is held at an off-state in this condition, no error data are written into the T-cell.

In order to write "1" data, one of the bit line pair, BL0 (or BL1), is boosted to the higher level voltage $V_{HH}$ from the high level voltage $V_H$, and the other, /BL0 (or /BL1), is pulled down to the low level voltage $V_L$ from the high level voltage $V_H$. And, similarly to the "0" write mode, the high level voltage $V_H$ is applied to the word line WL in the former half T1 of the above-described bit line selection period, and then the low level voltage $V_{LL}$ is applied to the same in the latter half T2.

As a result, in the former half T1, one of the cell pair, C-cell, is written into a "0" data state because the cell diode is forward-biased due to the high level voltage $V_H$ of the word line WL and the low level voltage $V_L$ of the bit line /BL0 (or /BL1). In the latter half T2, the other cell, T-cell, is written into a "1" data state because the low level voltage $V_{LL}$ of the word line WL and the high level voltage $V_{HH}$ of the bit line BL0 (or BL1) cause the cell diode to breakdown. No erroneous writes occur in both the former half for "0" writing and the latter half for "1" writing, similarly to the above-described "0" writing mode.

As apparent from FIG. 15, "0", "1" writing into a cell pair may be selected by reversing the voltages applied to the bit line pair, while the same voltage is applied to the word line. Therefore, it is possible to perform simultaneous data writing into two pairs of cells with a shared word line.

Figure 16:
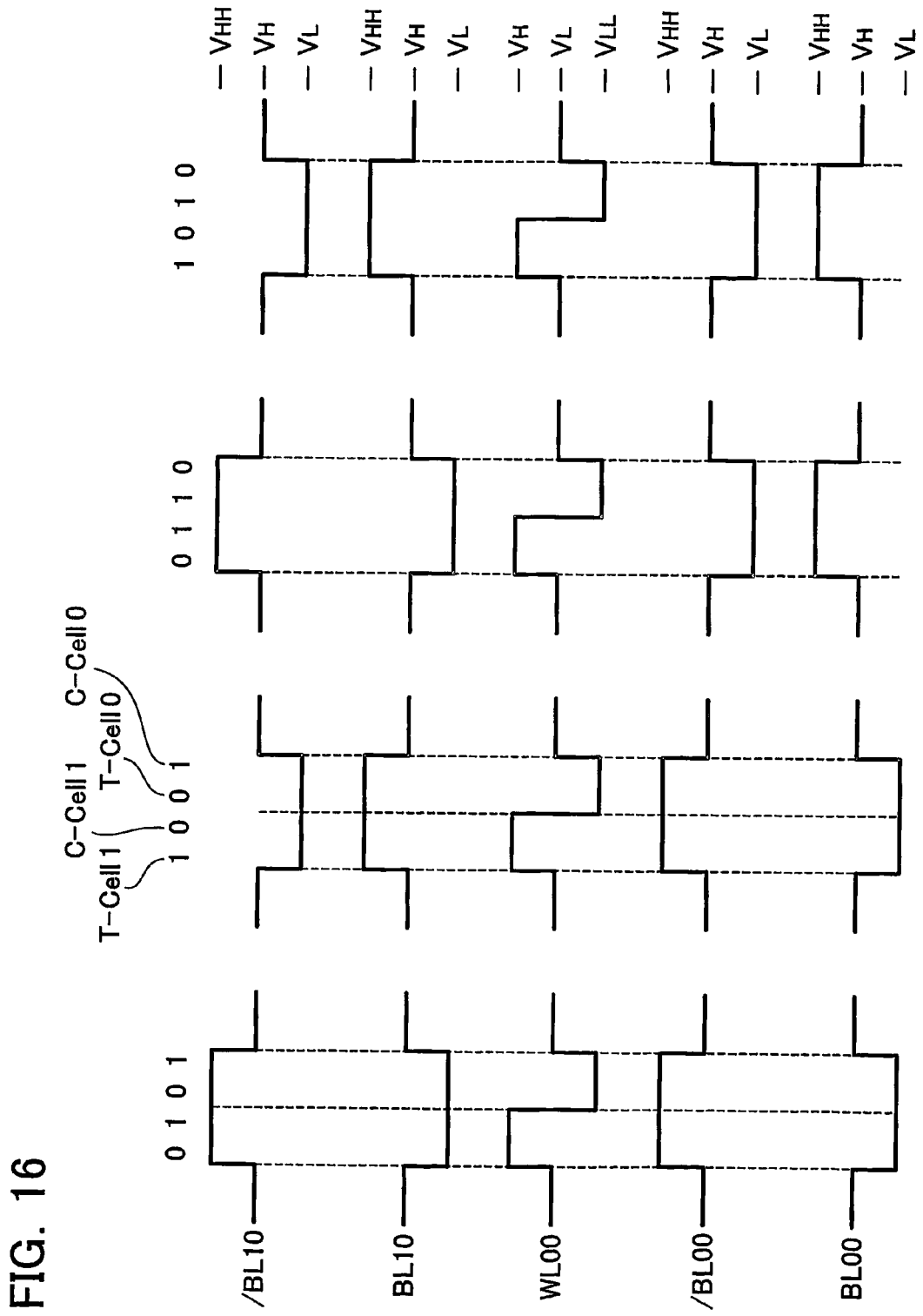
FIG. 16 is a diagram showing operation wave forms for explanation of data write for a two pair cell in adjacent two cell arrays.

FIG. 16 shows in detail waveforms of simultaneous data writing into two cell pairs, (T-cell 0, C-cell 0) and (T-cell1, C-cell1), which are adjacent up and down with a shared word line WL00. The data combinations of the two pair cells are expresses as four values "00", "01", "10" and "11". Corresponding to the four values data, in FIG. 16, bit data of T-cell1, C-cell1, T-cell0 and C-cell0 are shown at upsides of the respective waveforms. To the respective bit line pairs, (BL00, /BL00), (BL10, /BL10), the high level voltage $V_{HH}$ and the low level voltage $V_L$ are applied in correspondence with to-be-written data. The voltages applied to the word line WL00 are changed all the same for the four data such that the high level voltage $V_H$ and the low level voltage $V_L$ are applied in the former half and the latter half respectively in the bit line selection period, similarly to that in FIG. 15. By use of such waveforms, two cell pairs may be simultaneously written.

As is apparent from the above-described write operations, it should be appreciated that it is possible to simultaneously access the respective plural cell pairs within the first and second cell arrays MA0 and MA1 with shared word lines. Similarly, it is possible to simultaneously access the respective plural cell pairs within the third and fourth cell arrays MA2 and MA3 with shared word lines. In contrast to this, note that it is not possible to simultaneously access the second and third cell arrays MA1 and MA2 with shared bit lines.

Figure 17:
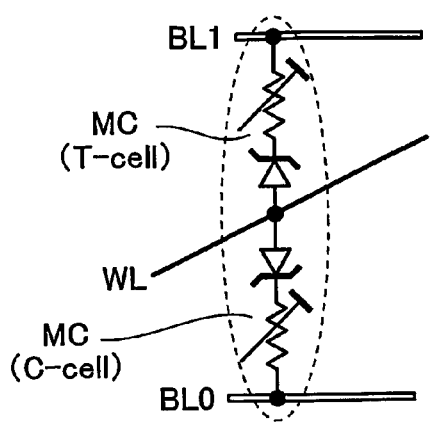
FIG. 17 shows another pair cell configuration method.

Up to this point, it has been explained that such a cell pair configuration laterally neighbouring two memory cells constitute a cell pair in each cell array layer in the three-dimensional cell array. However, the cell pair configuration method is not so limited. As shown in FIG. 17, it is possible to select a vertically neighbouring pair of memory cells MC with a shared word line WL so as to constitute a cell pair (i.e., a true cell, T-cell, and a complementary cell, C-cell). In this case, the bit lines BL0, BL1 which belong to different cell arrays become a pair of bit lines to be connected to the pair cell.

Figure 18:
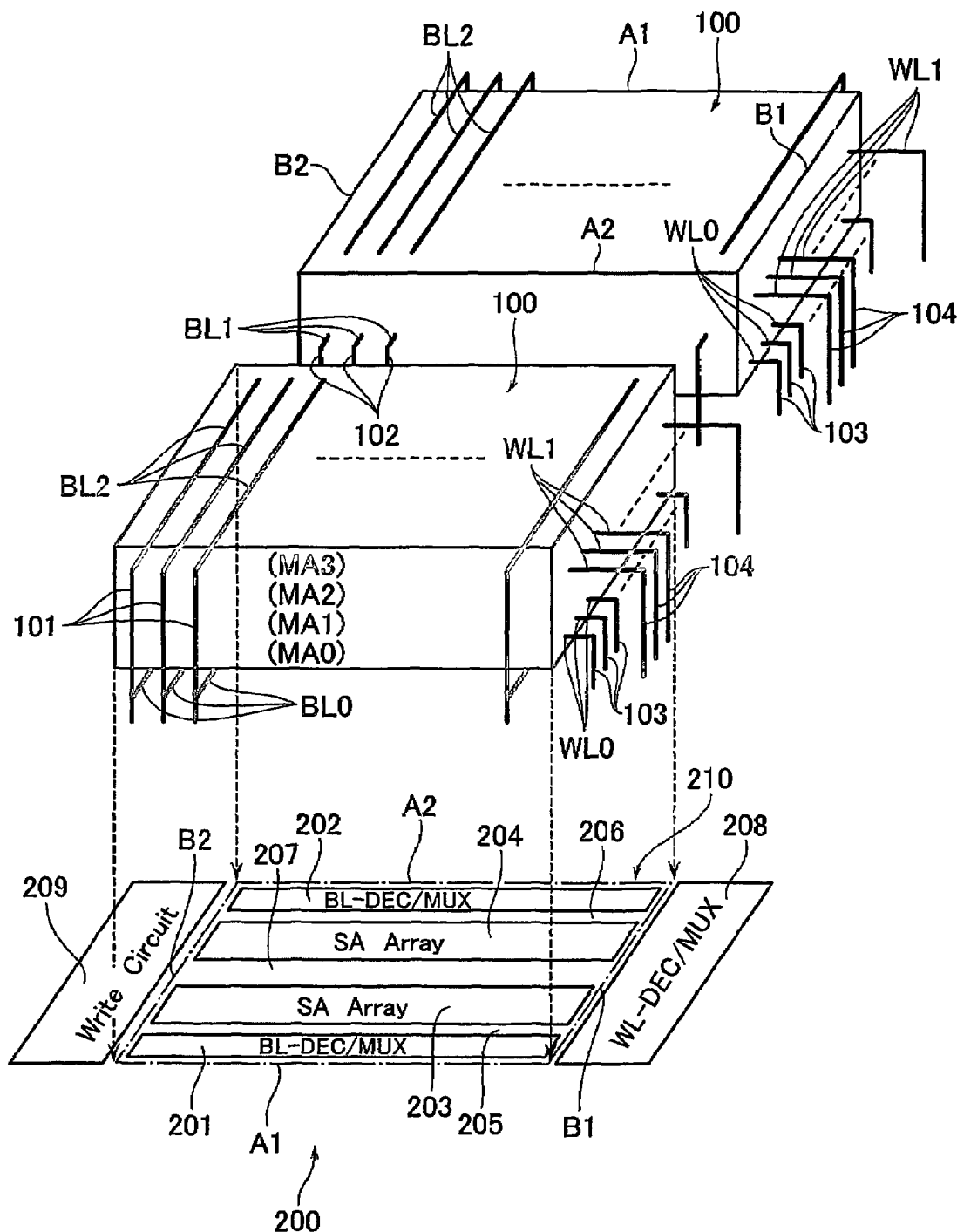
FIG. 18 is a perspective view showing a stack structure of the three-dimensional cell array and a read/write circuit thereof according to the embodiment.

FIG. 18 is a schematic perspective view showing a stacking state of cell blocks 100 and a read/write circuit 200 and interconnection relationships therebetween. Each cell block 100 corresponds to the above-described 3D cell array with four layers. A 3D cell array is, when necessary, divided into a plurality of cell blocks 100 with a predetermined capacity. In FIG. 18, two cell blocks 100 are arranged in a direction along the bit lines.

As shown in FIG. 18, the read/write circuit 200, which is used for data reading and writing in communication with the cell block 100, underlies the cell block 100. The read/write circuit 200 is formed such that the main portion thereof is disposed within a rectangular cell layout region 210 defined on the substrate 10, above which the cell block 100 is stacked. The cell layout region 210 is defined by two boundaries A1 and A2 in the direction of the bit lines, and by two boundaries B1 and B2 in the direction of the word lines.

A group of bit lines BL0 of the first cell array MA0 and a group of bit lines BL2 of the fourth cell array MA3 are drawn to the first boundary A1 side to be connected to a bit line select circuit 201, which is disposed along the boundary A1 in the read/write circuit 200, through vertical wirings (i.e., passages that vertically run to the substrate) 101 that are disposed along the boundary A1. A group of bit lines BL1 shared by the second and third cell arrays MA1 and MA2 are drawn to the second boundary A2 side to be connected to another bit line select circuit 202, which is disposed along the boundary A2 in the read/write circuit 200, through vertical wirings 102 that are disposed along the second boundary A2.

The reason why the bit lines BL0 and BL2 are drawn to the same side to be commonly connected to the bit line select circuit 201 through the vertical wirings 101 is such a fact that these groups of bit lines are not simultaneously activated. In detail, cell arrays MA0 and MA1 are simultaneously activated because these have shared word lines WL0. Similarly to this, cell arrays MA2 and MA3 are simultaneously activated because these have shared the word lines WL1. However, since the cell arrays MA1 and MA2 share the bit lines BL1, the lower cell arrays (MA0, MA1) and the upper cell arrays (MA2, MA3) are not activated simultaneously. The bit line select circuits 201, 202 include bit line decoders/multiplexers (BL-DEC/MUX).

The word lines WL0 and WL1 are drawn to the third boundary B1 side to be connected to word line select circuit 208, which is disposed along the boundary B1 in the read/write circuit 200, through vertical wirings 103 and 104, respectively, that are disposed along the boundary B1. The word line select circuit 208 has word line decoders/multiplexers (WL-DEC/MUX).

A central portion of the read/write circuit 200 serves as a global bus region 207, in which I/O data lines and pulse signal lines are disposed crossing this region in the direction of the word lines. Between this global bus region 207 and the bit line select circuits 201 and 202, are disposed sense amplifier arrays 203 and 204, respectively. Signal lines formed at the global bus region 207 are shared by the sense amplifier arrays 203 and 204. The sense amplifiers in the sense amplifier arrays 203 and 204 are connected to bit line select circuits 201 and 202 through signal lines disposed at local bus regions 205 and 206, respectively. Therefore, some selected from the bit lines BL0 or BL2 by the bit line select circuit 201 are connected to the sense amp array 203. Similarly, some selected from the bit lines BL1 by the bit line select circuit 202 are connected to the sense amp array 204.

The I/O data lines and pulse signal lines disposed at the global bus region 207 are drawn to the fourth boundary B2 side of the cell layout region 210. Along this boundary B2, disposed is a write circuit (i.e., write pulse generator circuit) 209 for applying write pulse signals to selected bit lines.

Figure 19:
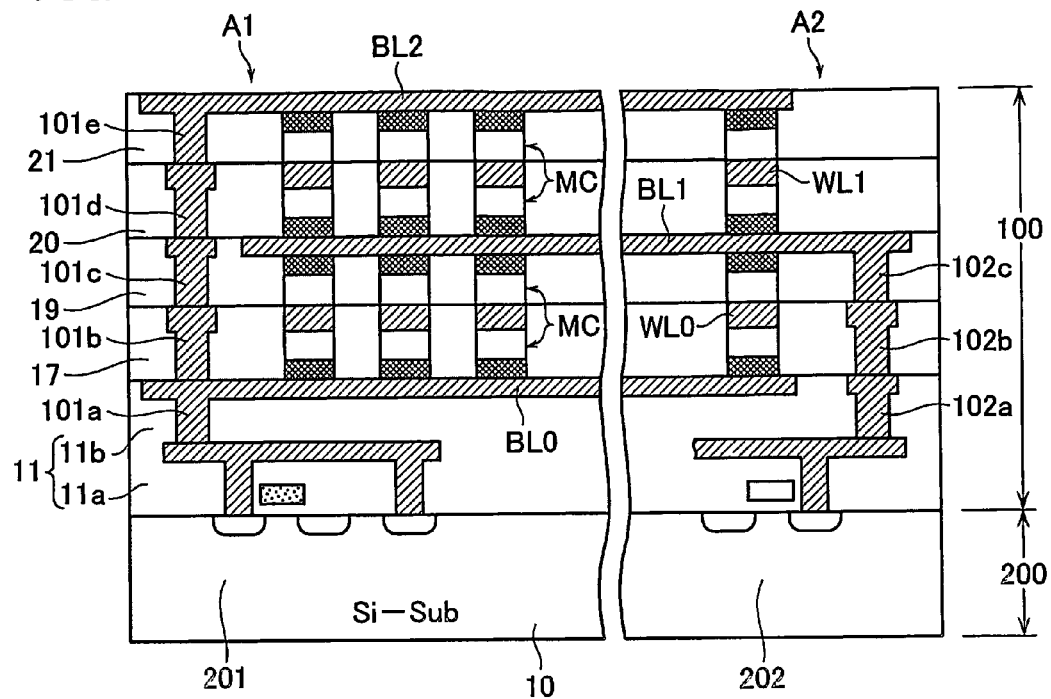
FIG. 19 is a cross-sectional diagram showing the interconnection relationship between bit lines of the cell array and the read/write circuit.
Figure 20:
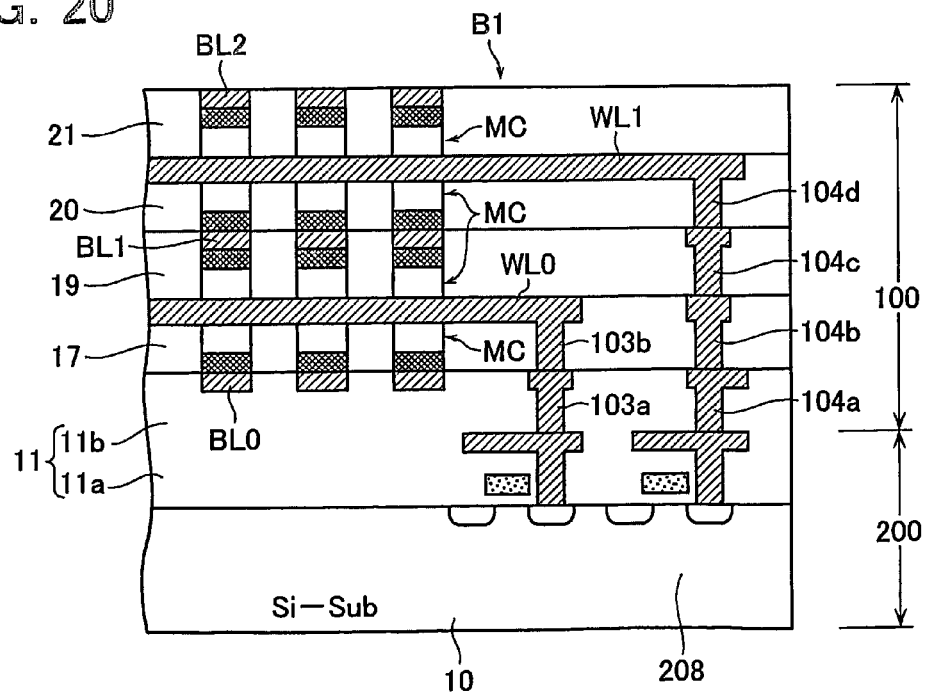
FIG. 20 is a cross-sectional diagram showing the relationship between word lines and the read/write circuit.

As above-described referring to FIG. 18, bit lines and word lines of the cell arrays are connected to the read/write circuit 200 formed on the substrate 10 through the vertical wirings 101 to 104. Practically, these wirings 101 to 104 are formed of contact plugs buried in interlayer dielectric films formed surrounding the cell array. The structural examples of the interconnections are shown in FIGS. 19 and 20. FIG. 19 shows a connection state between the bit lines and the read/write circuit 200 on a cross-section along the bit lines of the cell array. FIG. 20 shows a connection state between the word lines and the read/write circuit 200 on a cross-section along the word lines of the cell array.

As shown in FIGS. 19 and 20, the read/write circuit 200 has necessary transistors and metal interconnections formed on an interlayer dielectric film 11a covering the transistors. The read/write circuit 200 is covered by an interlayer dielectric film 11b, and the four layered cell arrays are formed thereon. Therefore, the interlayer dielectric films 11a and 11b constitute the insulator film 11 shown in FIGS. 8 and 9.

As shown in FIG. 19, the vertical wirings 101, which are used to connect the bit lines BL0, BL2 drawn toward the boundary A1 of the cell layout region 210 to the bit line select circuit 201, are composed of contact plugs 101a to 101e buried in the interlayer dielectric films 17, 19, 20 and 21. Similarly, the vertical wirings 102, which are used to connect the bit lines BL1 drawn toward the boundary A2 of the cell layout region to the bit line select circuit 202, are composed of contact plugs 102a to 102c buried in the interlayer dielectric films 11, 17 and 19.

As shown in FIG. 20, the vertical wirings 103, which are used to connect the word lines WL0 drawn toward the boundary B1 of the cell layout region to the word line select circuit 208, are composed of contact plugs 103a and 103b buried in the interlayer dielectric films 11 and 17. The vertical wirings 104, which are used to connect the word lines WL1 drawn toward the same side as the word lines WL0 to the word line select circuit 208, are composed of contact plugs 104a to 104d buried in the interlayer dielectric films 11, 17 and 20.

Although the lowest contact plugs 101a, 102a, 103a and 104a of the laminated cell arrays in FIGS. 19 and 20 are connected to metal wirings of the read/write circuit 200, it is possible to directly connect these to source/drain diffusion layers of the transistors. FIGS. 19 and 20 show an example in which the contact plugs are formed of metal films used for bit lines and word lines. The fabrication steps will be described later. Additionally, it is appreciated that the contact plugs may be formed of other metal films different from the bit lines and word lines or polycrystalline silicon films.

One cell block 100 shown in FIG. 18 includes, for example, 512 bit lines (BL) and 128 word lines (WL) for one cell array. As described above, two memory cells store one bit data in this embodiment. In this case, one cell block has a memory space of 256 columns (Col)×128 rows(Row). The memory capacity can be increased by increasing the number of cell blocks to be arranged. In order to achieve a high-speed access in such a large capacitive memory, it is necessary to perform parallel access for multi-bit data. For example, in order to perform 32-bits parallel access, one cell block is to be divided into two parts in the word line direction, and into 32 parts in the bit line direction, whereby 64 cell units are obtained. As a result, each cell unit has a capacity of 32IO×4Col×4 Row×4. On the global bus region 207, data lines and pulse signal lines are disposed for 64IO data input/output.

Figure 21:
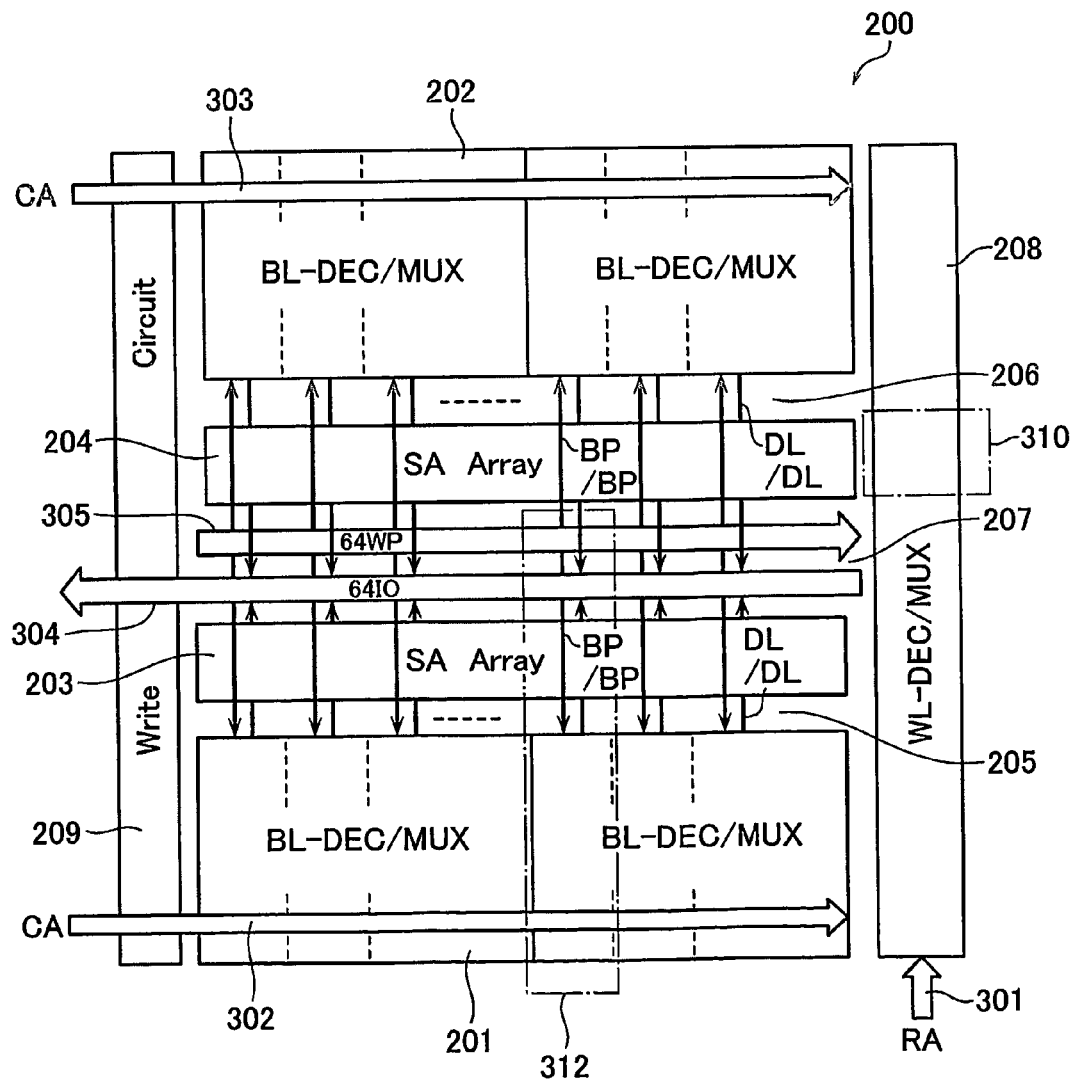
FIG. 21 is a diagram showing a layout of the read/write circuit.

FIG. 21 shows a schematic layout of the read/write circuit 200 with respect to one cell block 100 shown in FIG. 18 in a case that the above-described cell block construction is used. On the word line select circuit (WL-DEC/MUX) 208 as been disposed at the right side in FIG. 21, disposed are row address (RA) signal lines 301, which vertically run for selecting one each (i.e., upper and lower ones) from 128×2 word lines in the cell block 100. The write circuit 209 disposed at the left side in FIG. 21 outputs pulse signals with high level voltage $V_{HH}$ and low level voltage $V_L$ that are supplied to selected bit lines in a write mode (see FIG. 15). Write pulse signal lines (WP) 305 which transfer the write pulse signals are disposed so as to laterally run on the global bus region 207. In parallel with the write pulse signal lines 305 on the global bus region 207, main data lines 304 are disposed, on which read out data are transferred.

One cell unit is selected in one cell block, and cell data of lower two cell arrays or upper two cell arrays in each cell unit are simultaneously activated. Therefore, data lines 304 are prepared for 32IO×2=64IO. The write pulse signal lines are the same. In detail, in a read mode, read data on plural bit lines, which are respectively selected from the lower two cell arrays (MA0, MA1) or the upper two cell arrays (MA2, MA3) by the bit line select circuits 201 and 202, are simultaneously sensed by the sense amp arrays 203 and 204, and then simultaneously transferred to the data lines 304. In a write mode, write pulse signals, which are to be supplied to plural bit lines respectively selected from the lower two cell arrays (MA0, MA1) or the upper two cell arrays (MA2, MA3), are output to the write pulse signal lines 304 from the write circuit 209, and then transferred to the plural bit lines respectively selected by the bit line select circuits 201 and 202.

On the lower and upper ends of the read/write circuit 200, are disposed the bit line select circuits 201 and 202, respectively. Column address (CA) signal lines 302 and 303 are disposed to laterally run on the respective regions. One of the bit line select circuits, i.e., circuit 201, selects 32 bit line pairs from 512 bit line pairs (=64IO×4Col) in the upper two cell arrays, and the other selects 32 bit line pairs from 512 bit line pairs in the lower two cell arrays. Therefore, on the respective local bus regions 205 and 206, are disposed four pairs of current pass lines BP, /BP for common 4-columns (=8 bit lines) data so as to cross the regions of sense amplifier arrays 203 and 204 for applying the pulse signals of the pulse signal lines 305 to bit lines selected by the respective bit line select circuits 201 and 202. Additionally, 64 pairs of local data lines DL, /DL for 4 data columns are disposed on the respective local bus regions 205 and 207, and these are connected to the respective sense amps in the sense amplifier arrays 203 and 204.

Figure 22:
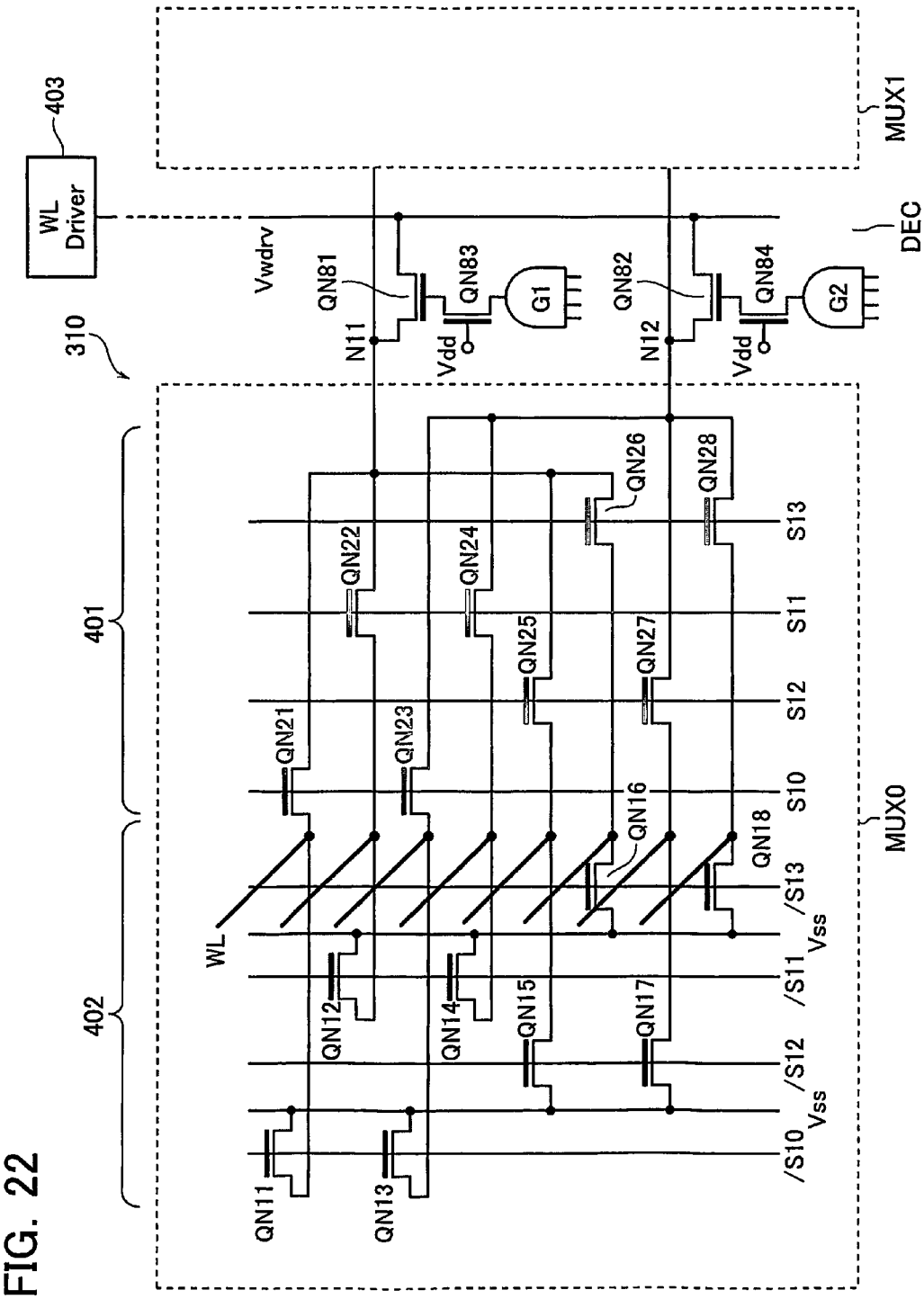
FIG. 22 is a diagram showing the word line select circuit portion of the read/write circuit.
Figure 23:
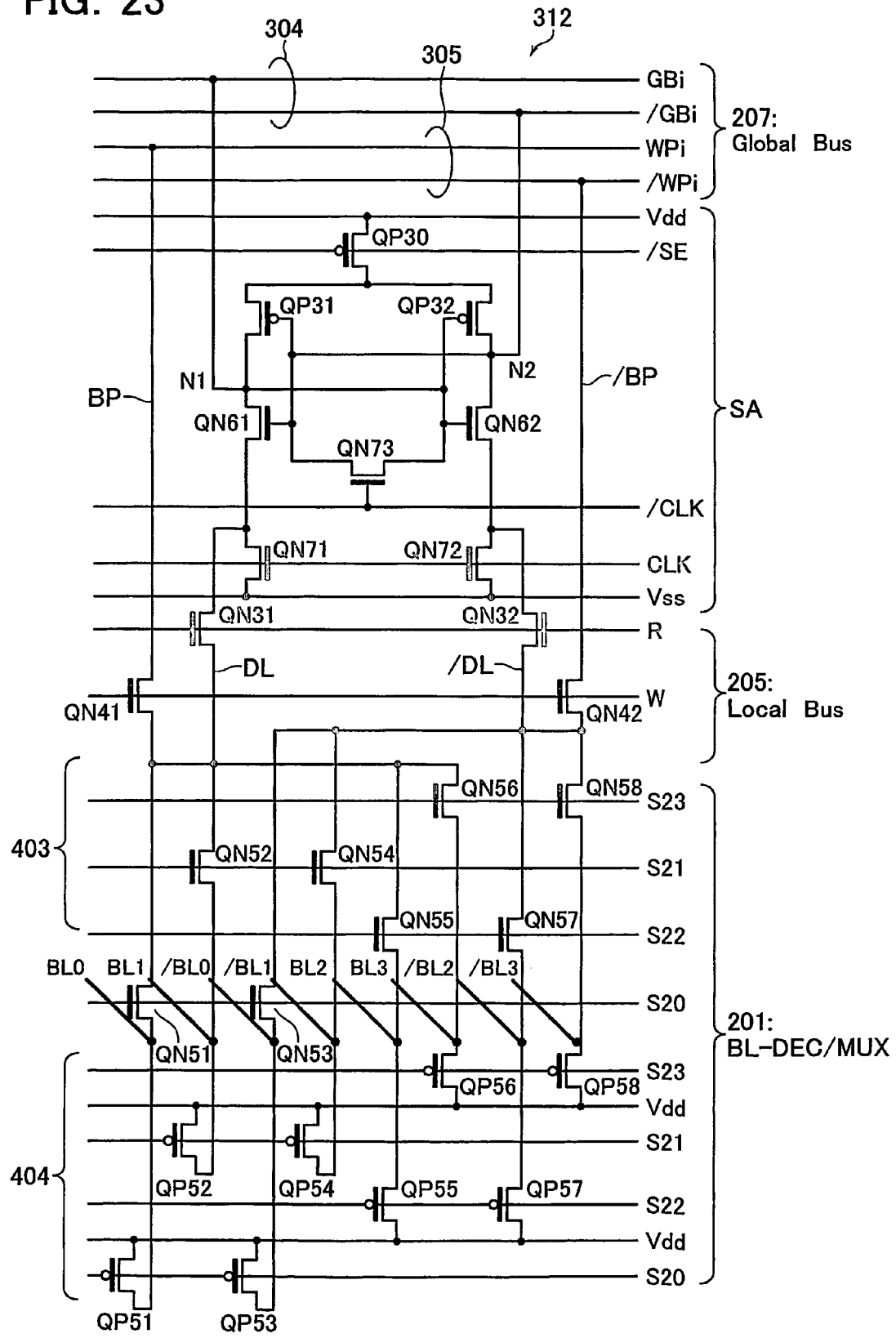
FIG. 23 is a diagram showing the bit line select circuit portion of the read/write circuit.

One circuit portion 310, that is to be connected to 4 Row×2 (=8 word lines) and another circuit portion 312, that is to be connected to 4 Col(=8 bit lines), each being surrounded by a broken line in FIG. 21, are shown in FIGS. 22 and 23, respectively, in detail.

Two multiplexers MUX0 and MUX1 have select gate circuits for selecting the lower word lines WL0 shared by the cell arrays MA0 and MA1, and the upper word lines WL1 shared by the cell arrays MA2 and MA3, respectively. Eight word lines input to the multiplexer MUX0 in FIG. 22 correspond to the word lines WL0 of the lower two cell arrays in FIG. 18. Decoders DEC include decode gates G (G1, G2, . . . ) for selecting one of 32 cell units. The multiplexer MUX0 has a select gate circuit 401 composed of NMOS transistors QN (QN21 to QN24, QN25 to QN28, . . . ) that are driven by select signals S10 to S13 so as to select one from four word lines. These NMOS transistors QN21 to QN24 and QN25 to QN28 are commonly connected to nodes N11 and N12, respectively. To these nodes N11 and N12, is applied a word line drive signal Vwdrv output from a word line driver circuit 403 through self-boost transistors QN81 and QN82 which are selectively driven by the decode gates G1 and G2. The word line drive signals Vwdrv are held at the high level voltage $V_H$ in the read mode (see FIG. 14), or at the high level voltage $V_H$ in the former half and the low level voltage $V_{LL}$ in the latter half in the write mode (see FIG. 15). The gates of transistors QN81, QN82 are connected to the output nodes of the decode gates G1, G2 though NMOS transistors QN83, QN84 so as to be selectively charged at a high level by the outputs of the decode gates G1, G2. The word line drive signal Vwdrv is applied to a word line WL through on-state NMOS transistors QN81, QN82. Since the NMOS transistors QN81, QN82 are configured as transfer gates which are to be self-boosted by capacitive coupling between gates and sources therebetween, the word line drive signal Vwdrv, which are changed between $V_H$ and $V_{LL}$, is transferred to the word line WL without voltage drops.

The multiplexer MUX0 has a reset circuit 402 composed of NMOS transistors QN (QN11 to QN14, QN15 to QN18, . . . ) for holding non-selected word lines as being at low level voltage $V_L$=Vss. The multiplexer MUX1 is composed as similar to the multiplexer MUX0.

A sense amp SA shown in FIG. 23 is one of 32 sense amps in the sense amp array 205 shown in FIG. 21. Four pairs of eight bit lines BL0, /BL0 to BL3, /BL3 connected to the sense amp SA are ones selected from the bit line group BL0 or BL2 shown in FIG. 10. As previously described, since the lower two cell arrays MA0 and MA1 and the upper two cell arrays MA2 and MA3 are not activated at a time, the sense amplifier SA is commonly used for the lower cell arrays MA0, MA1 and the upper cell arrays MA2, MA3.

The sense amplifier SA is a CMOS flip-flop type current sensing amplifier with an activating PMOS transistor QP30. Two nodes N1 and N2 thereof are directly connected to a pair of lines GBi, /GBi in the global data lines 304, respectively. Drains of sensing NMOS transistors QN61 and QN62 are selectively connected to data lines DL and /DL through NMOS transistors QN31 and QN32, respectively, that are controlled by a read control signal R to turn-on during a read operation. Except on the data read time, the nodes N1 and N2 are shorted with each other by an equalizing transistor QN73. Data lines DL, /DL are connected to a pair of bit lines selected by the bit line decoder/multiplexer BL-DEC/MUX.

Drains of the sensing transistors QN61, QN62 may be selectively set at Vss or at floating states by NMOS transistors QN71, QN72 which are controlled by a clock CLK. Based on the operations of transistors QN71, QN72, it is possible to apply the low level voltage VLr(=Vss) shown in the waveforms of FIG. 14 to selected bit lines and to perform a positive feed-back operation of the sense amp SA when cell data are transferred to NMOS transistors QN61, QN62 in a data sense time.

The bit line decoder/multiplexer BL-DEC/MUX has a select gate 403 composed of NMOS transistors QN51 to QN54, and Q55 to Q58 controlled by decoded signals S20 to S23 for selecting one pair from four pairs of bit lines to connect these to the data lines DL and /DL, respectively. Additionally, the bit line decoder/multiplexer BL-DEC/MUX has a reset circuit 404 composed of PMOS transistors QP51 to QP54, and QP55 to QP58 for holding non-selected bit lines as being at a high level of Vdd.

The pair of data lines DL, /DL are connected to a pair of signal lines WPi, /WPi in the pulse signal lines 305 through NMOS transistors QN41, QN42 that are driven by a write control signal W to turn-on, and through signal lines BP, /BP.

In the above-described configuration, when a data read operation is performed, word lines selected by select gate circuit 403 become "H", and bit line pairs selected by select gate circuit 403 become "L". At this time, cell currents from the selected complementary cells on the selected bit line pair are transferred to the drains of NMOS transistors QN61, QN62 of the sense amp SA through data lines DL, /DL and through NMOS transistors QN31, QN32. During this operation, NMOS transistors QN71, QN72 are held at an off-state. Thereafter, clock CLK becomes "H" to turn-on the NMOS transistors QN71, QN72, whereby the drains of the sensing NMOS transistors QN61, QN62 are clamped at Vss. As a result, a differential voltage generated between the nodes N1 and N2 due to the difference of cell currents is positively fed back to be amplified such that one of the nodes N1, N2 becomes Vdd, while the other becomes Vss. Amplified cell data as above-described is output to the main data lines GBi, /GBi.

In a data write mode, the drive signal Vwdrv, which is at the high level voltage $V_H$ in the former half and at the low level voltage VL in the latter half, is applied to a selected word line. Simultaneously, write pulse signals, which are set at combinations among $V_{HH}$, $V_H$, $V_L$ and $V_{LL}$ corresponding to-be-written data, are applied to selected cell pairs through the write pulse signal lines WPi, /WPi, whereby data write operations are performed.

Figure 24:
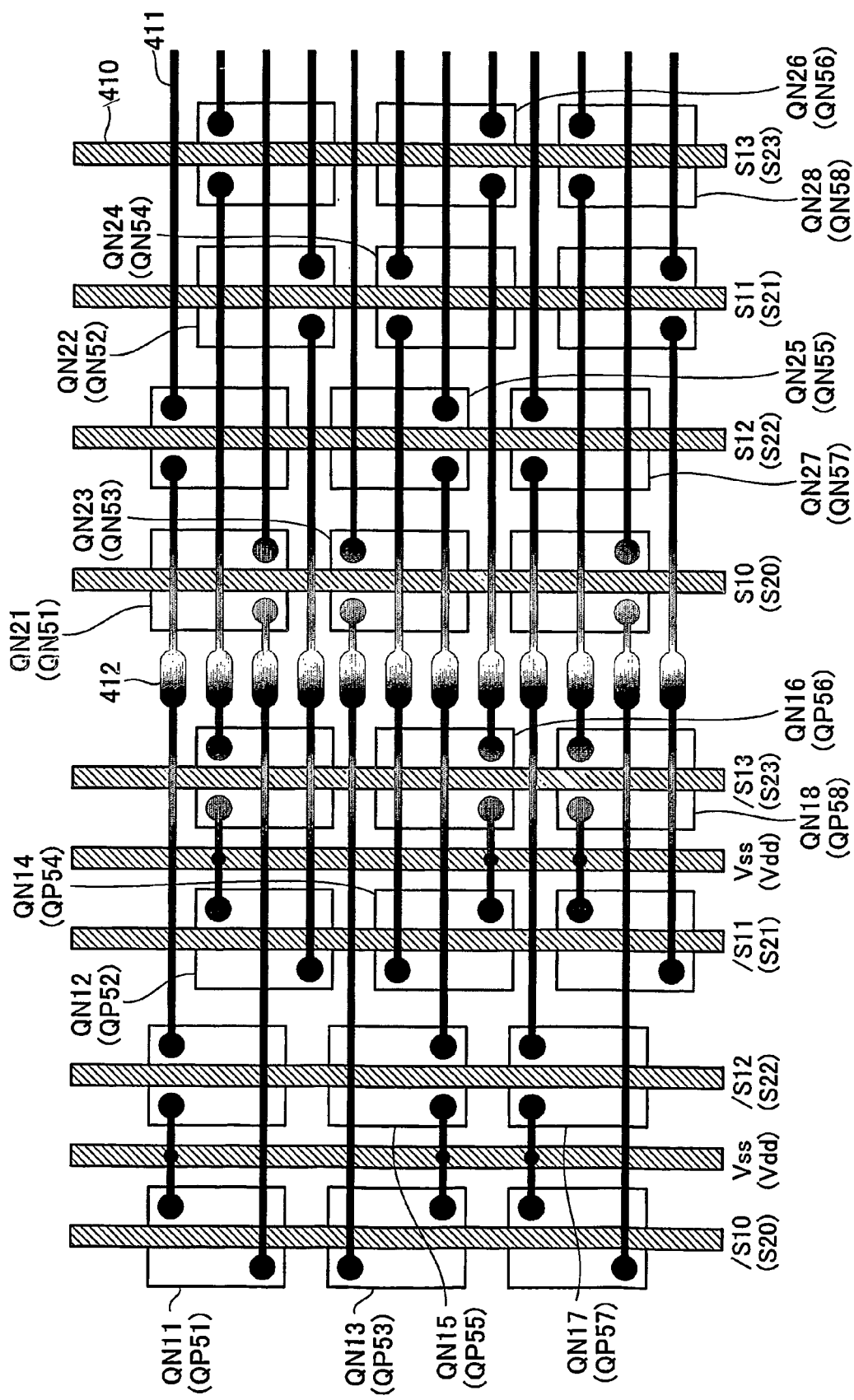
FIG. 24 shows a main portion layout of the transistor circuit shown in FIGS. 22 and 23.

Since one word line is commonly connected to many cell pairs, it is required for the word line to supply a large current to the cell pairs. In consideration of such a current value, it is required to design drivability of the word line decoder, resistance of the word line itself, the transistor size, and the like. It should be appreciated that the word line multiplexer MUX0 for eight word lines shown in FIG. 22 and the bit line decoder/multiplexer DEC/MUX for eight bit lines shown in FIG. 23 have the same circuit configuration. Therefore, these circuit regions may have the same layout as shown in FIG. 24. In FIG. 24, transistors QN21 to QN28, QN11 to QN18, select signals S10 to S13, /S10 to /S13 and low level power supply (Vss) lines in the circuit of FIG. 22 are shown, and in correspondence to these, transistors QN51 to QN58, QP51 to QP58, select signals S20 to S23 and high level power supply (Vdd) lines in the circuit of FIG. 12 are shown parenthesized. Although there is such a situation that the respective transistors corresponding to each other are of different conductivity-types, it is possible to use the same layout for these circuits.

Vertically running wirings 410 in FIG. 24 are gate lines of transistors that serve as select lines and power supply lines of Vdd, Vss. These may be simultaneously formed by patterning a polysilicon film. Since power supply lines Vss, Vdd are merely required to be potentially fixed as necessary for holding non-selected bit lines and word lines as being not floating, it is not required that these are not very low resistive. Therefore, it is able to use for these lines the same polysilicon film used for gate electrodes. Although laterally running wirings 411 are shown by schematic straight lines, these are metal wirings which are connected to sources and drains of transistors. Contact portions 412 serve as to connect the metal wirings 411 to bit lines and word lines, to which the vertical interconnection lines (i.e., contact plugs) 101 to 104 shown in FIG. 18 are connected.

Bit lines and word lines in the above-described cell array are preferably formed with a line/space of 1F/1F (F: minimum device-feature size). These bit lines and word lines are connected while holding the line pitch to the read/write circuit 200 on the substrate as shown in FIG. 18. In this case, the metal wirings 411 shown in FIG. 24 are formed to have the same line/space of 1F/1F. In contrast to this, transistors disposed on the way of the metal wirings 411 must have a large area necessary for supplying a required current. In consideration to this view point, in FIG. 13, each transistor is formed to have a gate width of three pitches of the metal wirings 411.

When the transistor size and metal wire pitch are determined as above-described, in order to effectively dispose the transistors, the select signal lines (S10, /S10)(S20), (S11, /S11)(S21), (S12, /S12)(S22) and (S13, /S13)(S23) which are suffixed in accordance with an address order of 0, 1, 2 and 3 are arranged in such an order of (S10, /S10)(S20), (S12, /S12)(S22), (S11, /S11)(S21) and (S13, /S13)(S23). As a result, between a transistor array of QN21 (QN51), QN23 (QN53) selected by the select signal line S10(S20) and a transistor array of QN23(QN52), QN24(QN54) selected by the select signal line S11(S21), disposed is a transistor array of QN25(QN55), QN27(QN57) selected by the select signal line S12(S22). By employing such the transistor arrangement, it is possible to dispose transistors with a large size within a metal wiring area in which wirings are arranged at a small pitch without idle spaces.

Figure 25:
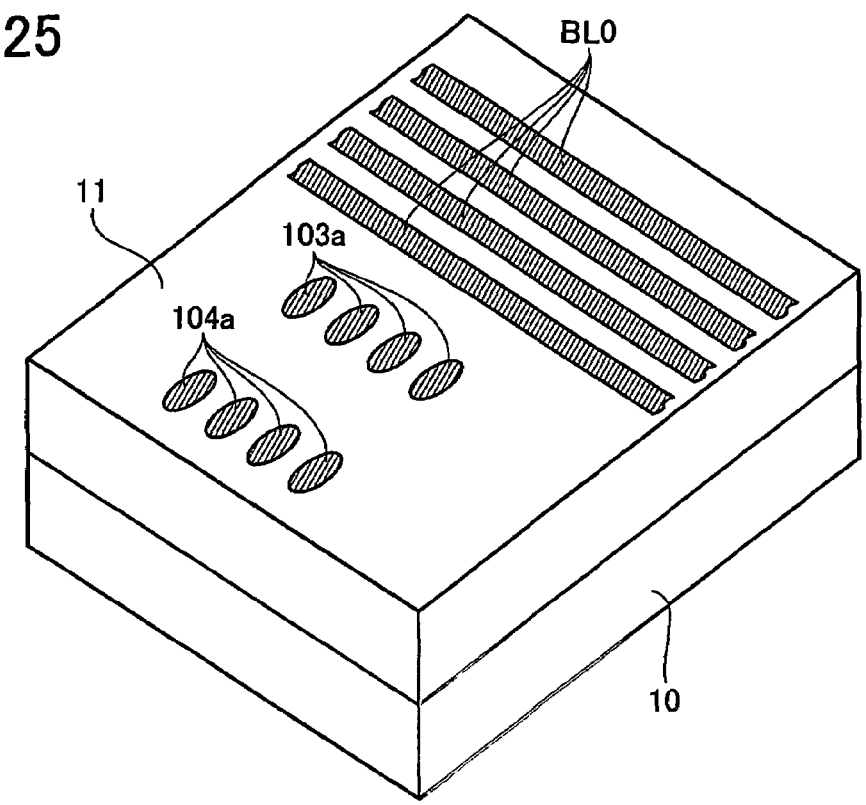
FIG. 25 is a perspective view of the cell array state after the bit line formation.

Next, referring to FIGS. 25 to 27, it will be explained that the bit lines, word lines and contact portions thereof to the read/write circuit 200 are simultaneously formed by use of a dual damascene method. FIG. 25 shows such a state that bit lines BL0 are formed on the interlayer dielectric film 11 covering the substrate 10 on which the read/write circuit 200 has been formed. Simultaneous with the formation of these bit lines BL0, are formed contact plugs 103a, 104a by a dual damascene process. These are used for connecting the word lines WL0, WL1 to be stacked thereon to the read/write circuit 200. Although not shown in FIG. 25, other contact plugs for connecting end portions of the bit lines BL0 to the read/write circuit 200 are formed simultaneously with the contact plugs 103a, 104a.

Figure 26:
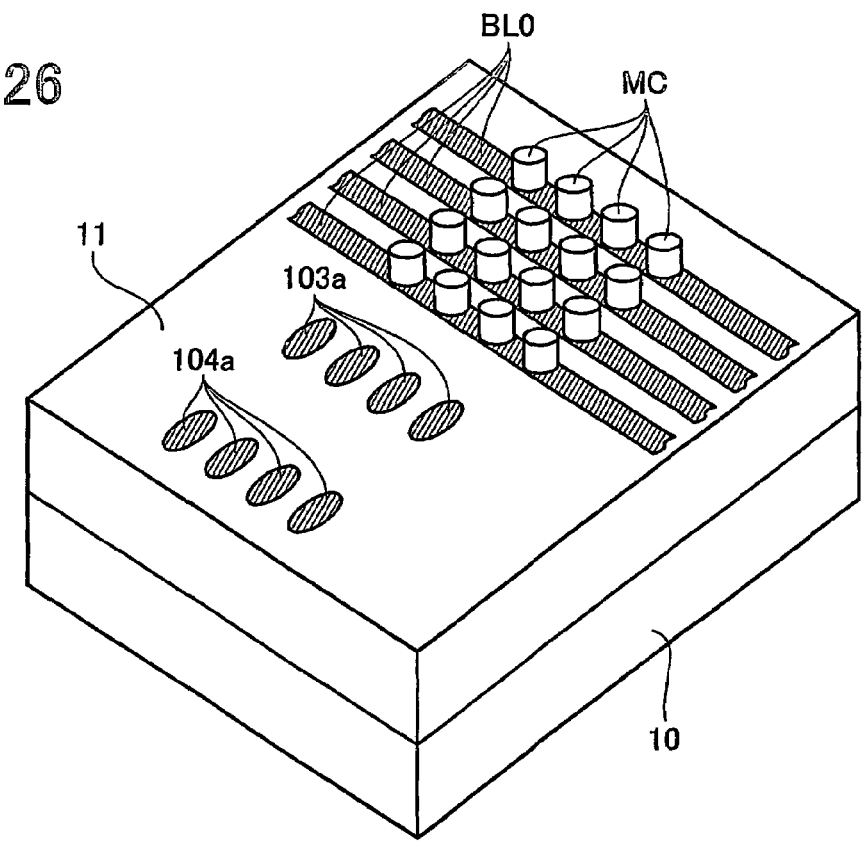
FIG. 26 is a perspective view of the cell array state after the memory cell formation on the bit lines.
Figure 27:
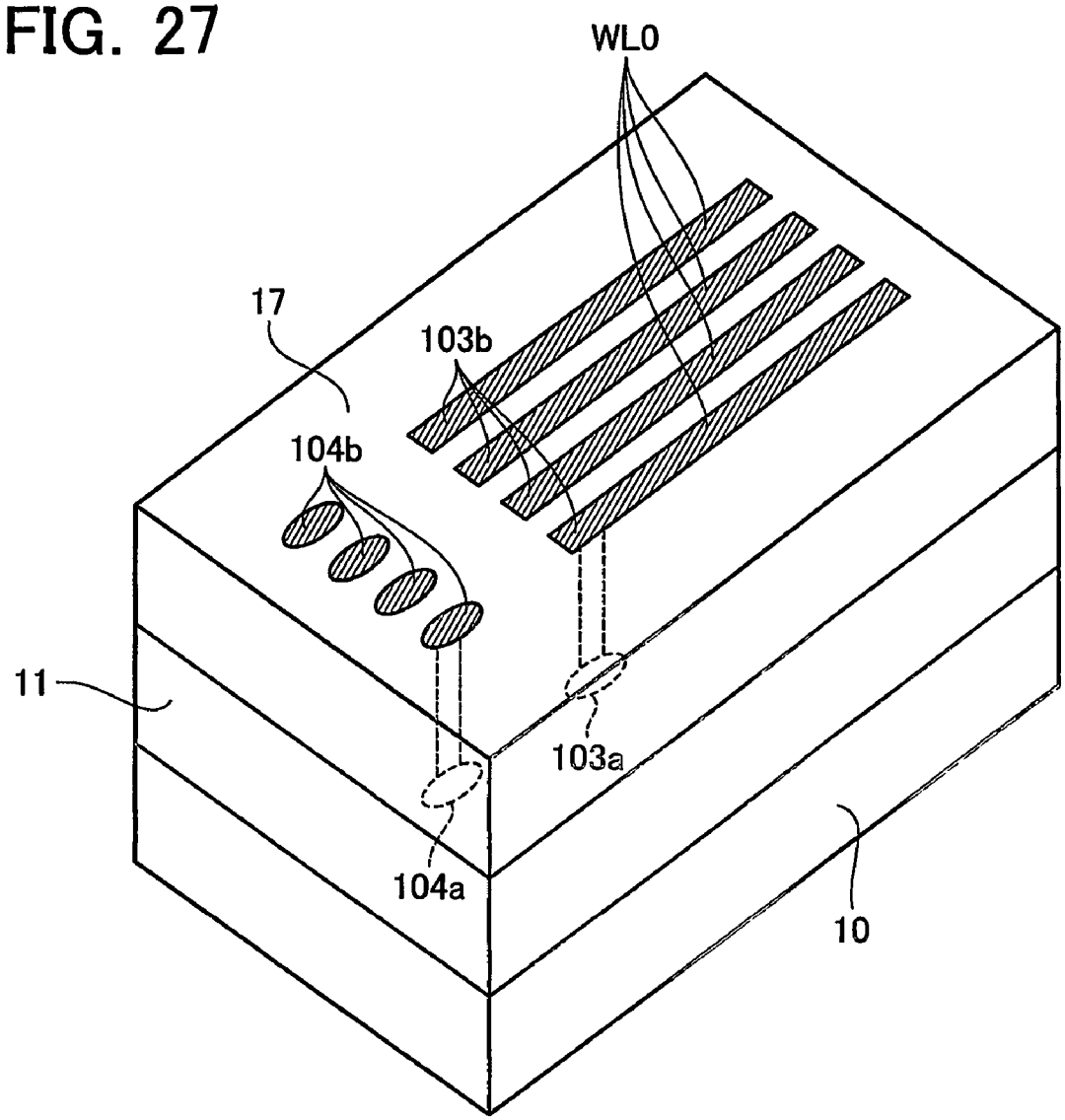
FIG. 27 is a perspective view of the cell array state after the word line formation.

Then, as shown in FIG. 26, memory cells, each of which is constituted by a programmable resistance element and a diode stacked with each other, are formed on the bit lines BL0 at a predetermined pitch. Next, as shown in FIG. 27, interlayer dielectric film 17 is deposited to cover the memory cells MC, and then word lines WL0 are formed on the film 17 by a dual damascene process. In this process, contact plugs 103b and 104b, which are to be connected to the contact plugs 103a and word lines WL1 to be formed next, respectively, are buried.

Figure 28A:
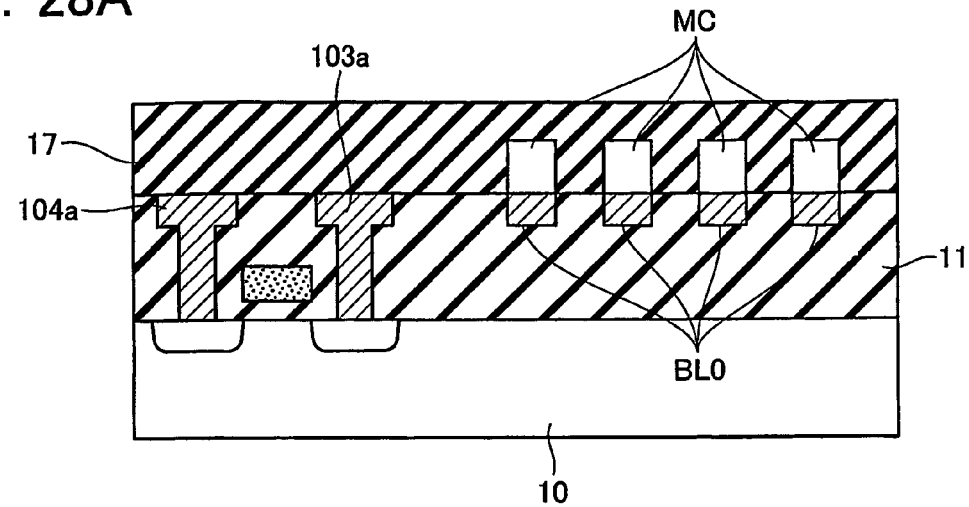
FIGS. 28A to 28C are cross-sectional views showing the word line forming process.
Figure 28B:
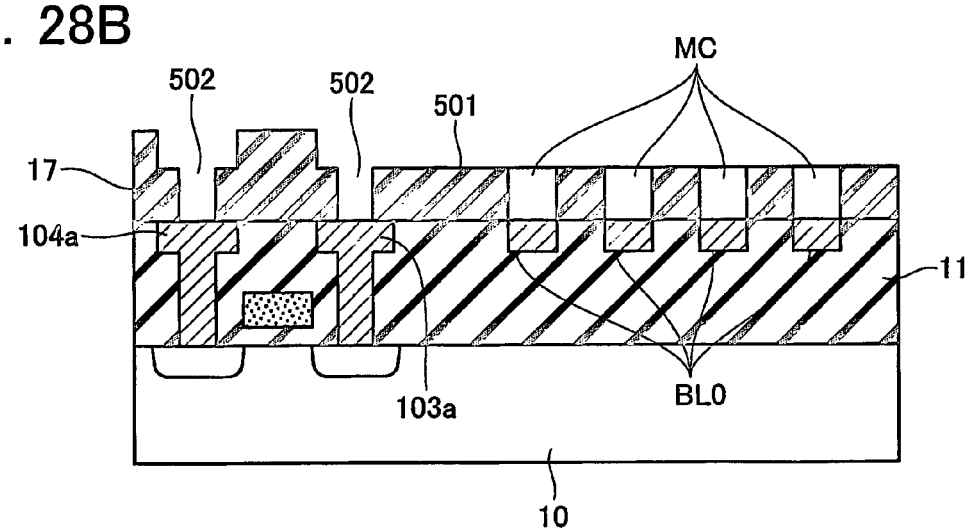
Figure 28C:
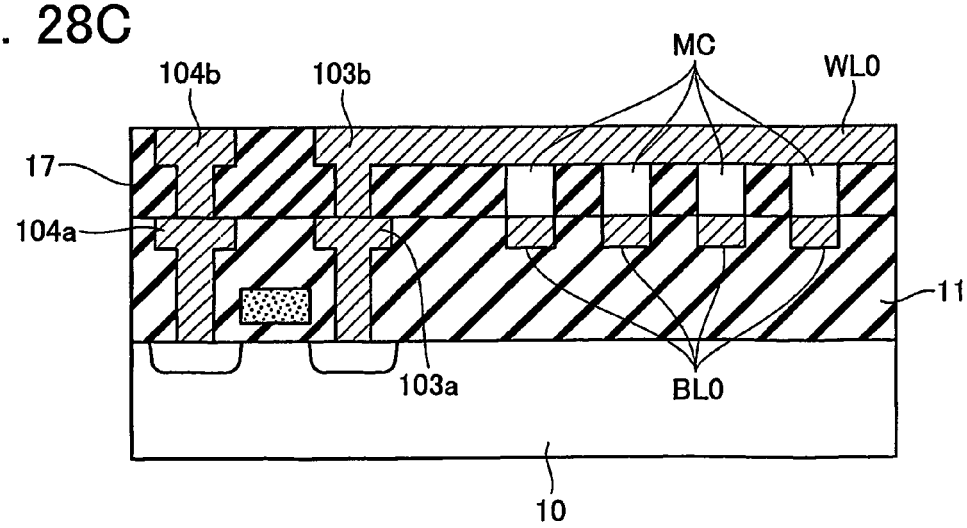

FIGS. 28A to 28C show the burying process of the word lines WL0 and contact plugs 103b, 104b in detail in a cross sectional view along the word line WL0 direction. FIG. 28A shows such a state that the interlayer dielectric film 17 is deposited to cover the memory cells MC and then planarized. Thereafter, as shown in FIG. 28B, wiring-burying trenches 501 are formed in the interlayer dielectric film 17 by an RIE (Reactive Ion Etching) process for word line burying so as to expose the upper ends of the memory cells MC. Further, contact holes 502 are formed at the positions where the contact plugs 103a, 104a have been buried so as to be deeper than the trenches 501. Then, a wiring material metal layer is deposited and processed by a CMP (Chemical Mechanical Polishing) method. As a result, as shown in FIG. 28C, the word lines WL0 and the contact plugs 103b, 104b are simultaneously buried and formed.

Continuously, memory cell formations, interlayer dielectric film depositions, wiring and contact plug formations by use of the damascene method are periodically performed. By use of such processes, as shown in FIGS. 19 and 20, four-layered cell arrays may be stacked in such a manner that the bit lines and word lines of each layer are connected to the read/write circuit on the substrate.

INDUSTRIAL APPLICABILITY

According to this invention, it is possible to provide a programmable resistance memory device in which a cell array and a read/write circuit are integrally formed in a small chip area.

The invention claimed is:

1. A programmable resistance memory device comprising:
a semiconductor substrate;
at least one cell array, formed above said semiconductor substrate, which comprises a plurality of bit lines arranged in parallel with each other, a plurality of word lines arranged in parallel with each other in such a direction as crossing said bit lines, and memory cells connected between the bit lines and the word lines at cross portions of the bit lines and the word lines, each said memory cell having a stack structure of a programmable resistance element and an access element, said programmable resistance element and an access element, said programmable resistance element being applied a voltage greater than a certain threshold to develop a high resistance state or a low resistance state and storing the high resistance state or the low resistance state in a non-volatile manner, said access element having a resistance value in an off-state that is ten times or more as high as that in a select state; and
a read/write circuit formed on said semiconductor substrate as underlying said cell array and connected to the bit lines and word lines through vertical wirings for data reading and data writing in communication with said cell array.

2. The programmable resistance memory device according to claim 1, wherein
said programmable resistance element comprises an ion conductor containing metal ions with anode and cathode electrodes sandwiching said ion conductor.

3. The programmable resistance memory device according to claim 1, wherein
said programmable resistance element comprises a polymer, in which conductive particles are dispersed, with anode and cathode electrodes sandwiching said polymer.

4. The programmable resistance memory device according to claim 1, wherein
said access element is a diode selected from a Zener diode, a PN junction diode and a Schottky diode.

5. The programmable resistance memory device according to claim 4, wherein
said memory cells are arranged on the bit lines at a certain pitch in a direction of an extension of a bit line, and
said each word line is commonly connected with the upper ends of said memory cells in such a direction as crossing said bit lines.

6. The programmable resistance memory device according to claim 5, wherein
said programmable resistance element and said diode serving as said access element of each said memory cell are stacked in such a manner that the respective anodes of said programmable resistance element and said diode are connected to said bit line and word line, respectively.

7. The programmable resistance memory device according to claim 6, wherein
a plurality of cell arrays are stacked in such a manner that at least one of said bit lines and word lines are shared with adjacent two cell arrays.

8. The programmable resistance memory device according to claim 7, further comprising:
first and second vertical wirings disposed outside of first and second boundaries that define a cell layout region of said cell arrays in the direction of said bit lines to connect said bit lines of the respective cell arrays to said read/write circuit; and
third vertical wirings disposed outside of one of third and fourth boundaries that define said cell layout region in the direction of said word lines to connect said word lines of the respective cell arrays to said read/write circuit.

9. The programmable resistance memory device according to claim 8, wherein
said first to third wirings are formed of contact plugs which are buried in an insulator layer formed to surround said cell arrays.

10. The programmable resistance memory device according to claim 4, wherein
said read/write circuit is configured to apply a first write voltage to a selected one of said memory cells to cause a diode thereof serving as said access element forward bias, thereby setting the programmable resistance element thereof at the low resistance state, and to apply a second write voltage with a polarity opposite to said first write voltage to the selected one of said memory cell to cause a diode thereof serving as said access element breakdown, thereby setting the programmable resistance element thereof at the high resistance state.

11. The programmable resistance memory device according to claim 10, wherein
said read/write circuit is configured to apply a read voltage lower than said first write voltage to the selected one of said memory cells to cause a diode thereof serving as said access element forward bias, thereby detecting a data sate of the programmable resistance element thereof.

12. The programmable resistance memory device according to claim 6, wherein
said read/write circuit is configured to apply a first write voltage to a selected one of said memory cells through a selected bit line and a selected word line to cause a diode thereof serving as said access element forward bias, thereby setting the programmable resistance element thereof at the low resistance state, and to apply a second write voltage with a polarity opposite to said first write voltage to the selected one of said memory cells through a selected bit line and a selected word line as to cause a diode thereof serving as said access element breakdown, thereby setting the programmable resistance element thereof at the high resistance state.

13. The programmable resistance memory device according to claim 12, wherein said read/write circuit is configured to apply a read voltage lower than said first write voltage to the selected one of said memory cells through a selected bit line and a selected word line to cause a diode thereof serving as said access element forward bias, thereby detecting a data sate of the programmable resistance element thereof.

14. The programmable resistance memory device according to claim 13, wherein said read/write circuit is configured to apply a hold voltage between said bit lines and word lines in a non-select state to hold said diodes of said memory cells at a high impedance off-state with a reverse bias.

15. The programmable resistance memory device according to claim 7, wherein neighbouring two memory cells in each said plurality of cell arrays constitute a pair cell for storing complementary data one of which is the high resistance state, and the other is the low resistance state, and wherein said complementary data of said pair cell are read out to a bit line pair as one bit of data.

16. The programmable resistance memory device according to claim 15, wherein two memory cells constituting said pair cell are laterally neighbouring in each of said plurality of cell arrays in such a manner that anodes of diodes thereof are commonly connected to one of said word lines and anodes of programmable resistance elements thereof are connected to a pair of bit lines.

17. The programmable resistance memory device according to claim 16, wherein one bit line of said pair of bit lines to which said complementary data are read out is disposed between bit lines of another pair of bit lines to which another complementary data are read out.

18. The programmable resistance memory device according to claim 15, wherein two memory cells constituting said pair cell are vertically neighbouring between neighbouring two cell arrays in said plurality of cell arrays in such a manner that anodes of diodes thereof are commonly connected to one of said word lines shared by said two cell arrays, and anodes of programmable resistance elements thereof are connected to bit lines disposed at said two cell arrays, respectively.

19. The programmable resistance memory device according to claim 8, wherein said read/write circuit comprises:

a global bus region having a plurality of data lines to which read data are transferred and a plurality of write pulse signal lines for transferring write pulse signals to said bit lines, said data lines and said write pulse signal lines being so disposed as to cross a central portion of said cell layout region in the direction of said bit lines;

first and second bit line select circuits disposed along said first and second boundaries of said cell layout region, respectively, to which the respective bit lines of neighboring two cell arrays are connected;

first and second sense amp arrays for sensing data of bit lines selected by said first and second bit line select circuits, respectively, said first and second sense amp arrays being disposed between said first, second bit line select circuits and said global bus region, respectively;

a word line select circuit disposed along one of said third and fourth boundaries of said cell layout region, to which shared word lines of said neighboring two cell arrays are connected; and a write circuit disposed along the other of said third and fourth boundaries of said cell layout region for generating said write pulse signals supplied to said write pulse signal lines.

20. The programmable resistance memory device according to claim 19, wherein a plurality of shared word lines selected by said word line select circuit are simultaneously activated, and a plurality of the respective bit lines of said neighboring two cell arrays selected by said first and second bit line select circuits are simultaneously selected, respectively, thereby simultaneously accessing the respective plural memory cells in said neighboring two cell arrays.

21. The programmable resistance memory device according to claim 20, wherein said first and second sense amp arrays have sense amps for simultaneously sensing data of the respective plural memory cells which are simultaneously selected in said neighboring two cell arrays, sensed data are simultaneously transferred to said data lines in said global bus region.

22. The programmable resistance memory device according to claim 20, wherein said write circuit is configured to simultaneously output write pulse signals, which are to be transferred to the plural bit lines simultaneously, to said write pulse signal lines in said global bus region.

23. The programmable resistance memory device according to claim 19, wherein neighbouring two memory cells in each said cell array constitute a pair cell for storing complementary data, one of which is the high resistance state and the other is the low resistance state, and wherein each of said first and second sense amp arrays comprises differential type current sensing amplifiers arranged therein, each of said current sensing amplifiers being connected to a bit line pair to which said pair cell is connected for sensing a current difference due to said complementary data.

24. A programmable resistance memory device comprising:

a semiconductor substrate;

at least one cell array, formed above said semiconductor substrate, which comprises a plurality of bit lines arranged in parallel with each other, a plurality of word lines arranged in parallel with each other in such a direction as crossing said bit lines, and memory cells connected between the bit lines and the word lines at cross points of the bit lines and word lines, each said memory cell having a stack structure of a programmable resistance element and an access element, said programmable resistance element storing a high resistance state or a low resistance state in a non-volatile manner, said access element having a resistance value at applying voltages V2 and V3 greater than resistance values at applying voltages V1 and V4 (where V4>V3>V2>V1); and a read/write circuit formed on said semiconductor substrate as underlying said cell array and connected to the bit lines and word lines through vertical wirings for data reading and data writing in communication with said cell array.

25. A programmable resistance memory device comprising:

a semiconductor substrate;

at least one cell array, formed above said semiconductor substrate, which comprises a plurality of bit lines arranged in parallel with each other, a plurality of word lines arranged in parallel with each other in a direction crossing said bit lines, and memory cells connected between the bit lines and the word lines at cross points of the bit lines and word lines, each said memory cell having a stack structure of a programmable resistance element and an access element, said programmable resistance element is applied one of a positive voltage and a negative voltage to change a resistance state from high to low, is applied the other one of the positive voltage and the negative voltage to change the resistance state from low to high and storing the high resistance state or the low resistance state in a non-volatile manner, said access element having a resistance value in an off-state that is ten times or more as high as that in a select state; and a read/write circuit formed on said semiconductor substrate as underlying said cell array and connected to the bit lines and word lines through vertical wirings for data reading and data writing in communication with said cell array.

* * * * *